(12) United States Patent
Morita

(10) Patent No.: US 11,624,960 B2
(45) Date of Patent: Apr. 11, 2023

(54) ELECTRO-OPTICAL DEVICE AND ELECTRONIC APPARATUS

(71) Applicant: SEIKO EPSON CORPORATION, Tokyo (JP)

(72) Inventor: Kikuya Morita, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/692,195

(22) Filed: Mar. 11, 2022

(65) Prior Publication Data

US 2022/0291555 A1 Sep. 15, 2022

(30) Foreign Application Priority Data

Mar. 12, 2021 (JP) .............. JP2021-039998

(51) Int. Cl.
*G02F 1/1362* (2006.01)
*G02F 1/1343* (2006.01)
*G02F 1/1333* (2006.01)
*H01L 27/12* (2006.01)
(Continued)

(52) U.S. Cl.
CPC ...... *G02F 1/136209* (2013.01); *G02F 1/1368* (2013.01); *G02F 1/133345* (2013.01); *H01L 27/1222* (2013.01); *H01L 27/1244* (2013.01); *H01L 27/1255* (2013.01); *H01L 27/1259* (2013.01); *H01L 29/78633* (2013.01);
(Continued)

(58) Field of Classification Search
CPC ............. G02F 1/1333; G02F 1/133302; G02F 1/133345; G02F 1/133357; G02F 1/133512; G02F 1/1343; G02F 1/134309; G02F 1/1362; G02F 1/136209; G02F 1/136213; G02F 1/136218; G02F 1/136227; G02F 1/136286; G02F 1/1368; G02F 2202/104; H01L 27/1222; H01L 27/1244; H01L 27/1255; H01L 27/1259; H01L 29/78633; H01L 29/78675
See application file for complete search history.

(56) References Cited

U.S. PATENT DOCUMENTS

2017/0102596 A1 4/2017 Sugimoto
2020/0117063 A1 4/2020 Sugimoto

FOREIGN PATENT DOCUMENTS

JP 2003-152086 5/2003
JP 2004-325627 11/2004
(Continued)

*Primary Examiner* — Thoi V Duong
(74) *Attorney, Agent, or Firm* — JCIPRNET

(57) ABSTRACT

An electro-optical device includes: a substrate extending along a first direction and having a recessed portion including a bottom surface and a side surface, a laminated film disposed along the bottom surface and the side surface of the recessed portion, and having a first conductive layer, a dielectric layer, and a second conductive layer, a first insulating film covering the laminated film, a portion of the first insulating film being disposed inside the recessed portion, a light shielding film, a second insulating film, and a semiconductor layer disposed along the first direction. The laminated film is arranged along the bottom surface and the side surface of the recessed portion, the first insulating film is disposed so as to include the recessed portion, and a length of side surface in a depth direction is larger than a length of the bottom surface in a width direction.

13 Claims, 12 Drawing Sheets

(51) Int. Cl.
*H01L 29/786* (2006.01)
*G02F 1/1368* (2006.01)

(52) U.S. Cl.
CPC .. *H01L 29/78675* (2013.01); *G02F 1/134309* (2013.01); *G02F 2202/104* (2013.01)

(56) References Cited

FOREIGN PATENT DOCUMENTS

| | | |
|---|---|---|
| JP | 2017-072741 | 4/2017 |
| JP | 2020-064130 | 4/2020 |

ELECTRO-OPTICAL DEVICE AND ELECTRONIC APPARATUS

The present application is based on, and claims priority from JP Application Serial Number 2021-039998, filed Mar. 12, 2021, the disclosure of which is hereby incorporated by reference herein in its entirety.

BACKGROUND

1. Technical Field

The present disclosure relates to an electro-optical device and an electronic apparatus.

2. Related Art

For example, an electro-optical device such as a liquid crystal display device capable of changing optical characteristics for each pixel is used for an electronic equipment such as a projector.

An electro-optical device disclosed in JP-A-2017-72741 includes an element substrate, a counter substrate, and a liquid crystal layer sandwiched between the element substrate and the counter substrate. The element substrate includes a base material, various lines having a light shielding property such as scanning lines and data lines, capacitance elements, transistors, and pixel electrodes.

In JP-A-2017-72741, a plurality of capacitance elements are provided for each pixel. By providing the plurality of capacitance elements for each pixel, a capacitance value can be increased. Further, the transistors, the plurality of capacitance elements, and the data lines are disposed in this order from the base material. Light incident on the transistor is shielded by the plurality of capacitance elements and a wiring structure such as data lines.

For this reason, in the conventional configuration, it is difficult to suppress lowering of a numerical aperture while increasing a capacitance value, and there is a possibility that a configuration for suppressing intrusion of light to a transistor is complicated so that a display quality is lowered.

SUMMARY

According to an aspect of the present disclosure, there is provided an electro-optical device including: a substrate extending along a first direction and having a recessed portion that includes a bottom surface and a side surface, a laminated film disposed along the bottom surface and the side surface of the recessed portion, and having a first conductive layer, a dielectric layer, and a second conductive layer, a first insulating film covering the laminated film, a portion of the first insulating film being disposed in the recessed portion, a light shielding film, a second insulating film, and a semiconductor layer having a source region, a channel region, and a drain region disposed along the first direction, wherein the laminated film, the first insulating film, the light shielding film, the second insulating film, and the semiconductor layer are disposed in this order from a substrate side, and a length of the recessed portion in a depth direction is larger than a length of a bottom surface of the recessed portion in a width direction along a second direction intersecting with the first direction.

According to another aspect of the present disclosure, there is provided an electronic apparatus including the above-mentioned electro-optical device, and a control unit configured to control an operation of the electro-optical device.

DESCRIPTION OF EXEMPLARY EMBODIMENTS

Figure 1:
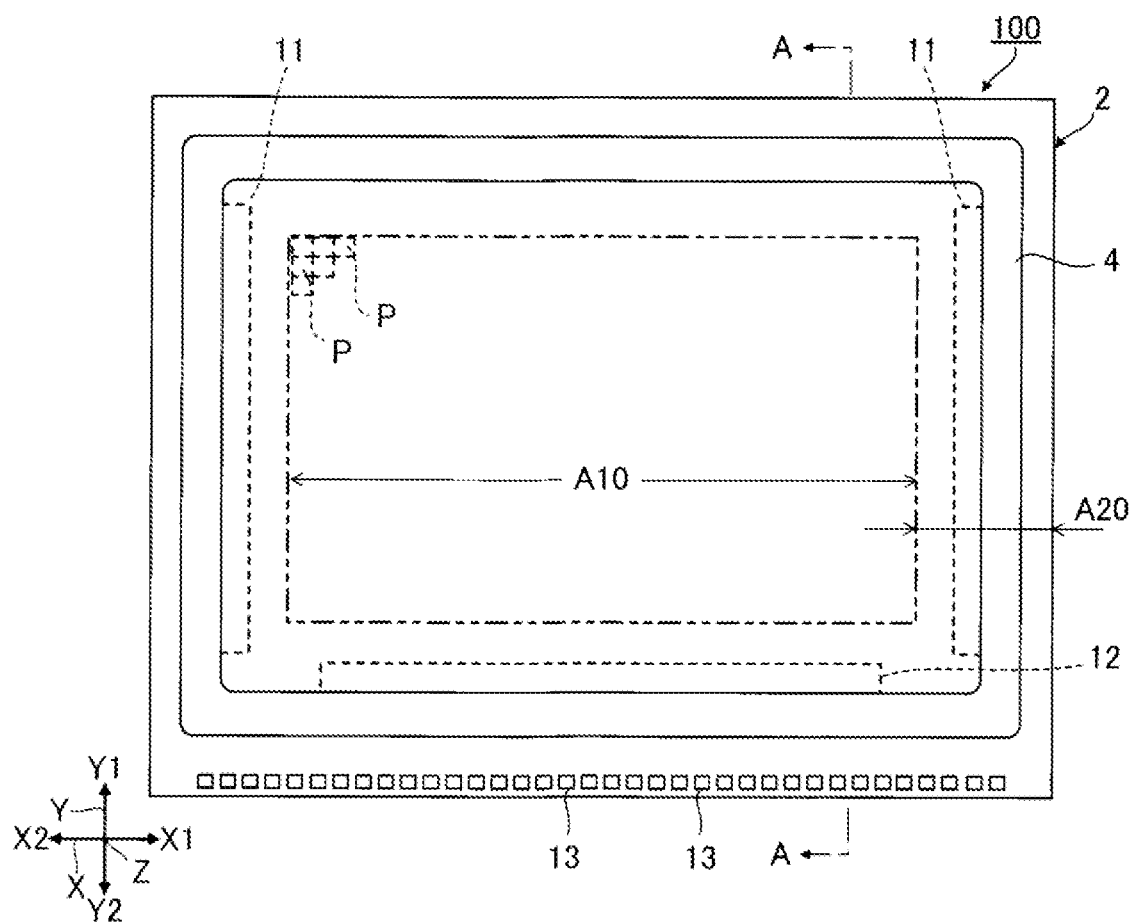
FIG. 1 is a plan view of an electro-optical device according to an embodiment.

Preferred embodiments of the present disclosure will be described below with reference to the accompanying drawings. Here, in the drawings, sizes and scales of respective parts are different from actual sizes and scales as appropriate, and some of the parts are schematically illustrated for facilitating understanding of the description. Further, the scope of the present disclosure is not limited to these embodiments unless otherwise stated to limit the present disclosure in the following descriptions.

1. Electro-Optical Device

1A. Basic Configuration

Figure 2:
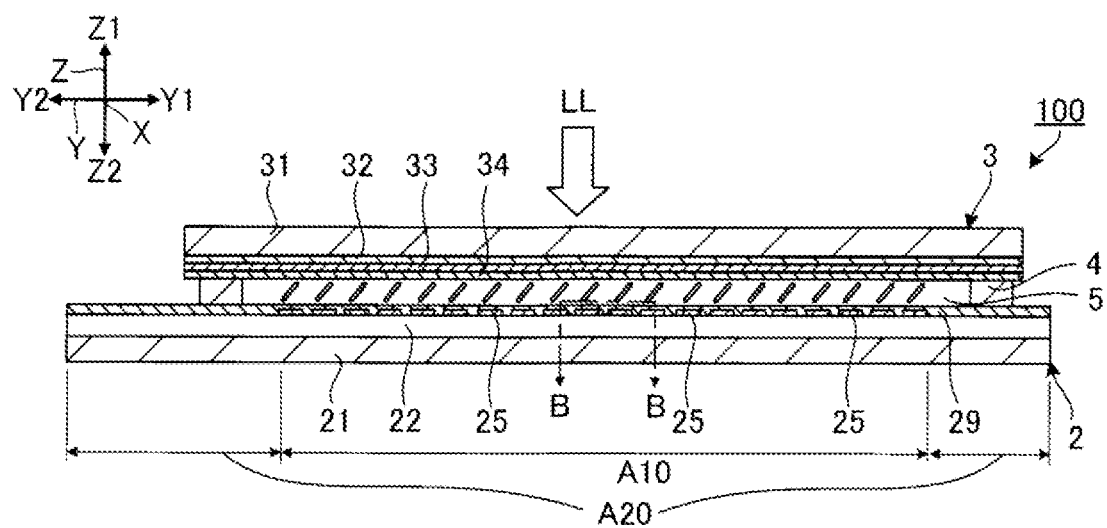
FIG. 2 is a cross-sectional view of the electro-optical device illustrated in FIG. 1 taken along a line A-A.

FIG. 1 is a plan view of an electro-optical device 100 according to an embodiment. FIG. 2 is a cross-sectional view of the electro-optical device 100 illustrated in FIG. 1 taken along a line A-A. In FIG. 1, an illustration of a counter substrate 3 is omitted. Here, for the sake of convenience of the description, the description will be made using an X axis, a Y axis, and a Z axis that are orthogonal to each other when appropriate. Further, one direction along the X axis is referred to as an X1 direction, and a direction opposite to the X1 direction is referred to as an X2 direction. In the same manner, one direction along the Y axis is referred to as a Y1 direction, and a direction opposite to the Y1 direction is referred to as a Y2 direction. One direction along the Z axis is referred to as a Z1 direction, and a direction opposite to the Z1 direction is referred to as a Z2 direction. Further, hereinafter, viewing in the Z1 direction or the Z2 direction is referred to as "plan view". Here, in the description made hereinafter, the X direction is the X1 direction or the X2 direction. The Y direction is the Y1 direction or the Y2 direction. The Z direction is the Z1 direction or the Z2 direction.

The electro-optical device 100 illustrated in FIG. 1 and FIG. 2 is an active-matrix-drive-type transmissive electro-optical device. As illustrated in FIG. 2, the electro-optical device 100 includes an element substrate 2, a counter substrate 3, a sealing member 4 having a frame shape, and a liquid crystal layer 5. The element substrate 2, the liquid crystal layer 5, and the counter substrate 3 are arranged in this order in the Z1 direction. Further, a shape of the electro-optical device 100 illustrated in FIG. 1 as viewed in plan view is a rectangular shape. However, the electro-optical device 100 may have a circular shape as viewed in plan view, for example.

The element substrate 2 illustrated in FIG. 2 is a substrate having a plurality of Thin Film Transistors (TFT) described later. The element substrate 2 includes a first substrate 21 having a light transmissivity, a laminated body 22 having a light transmissivity, a plurality of pixel electrodes 25 having a light transmissivity, and a first alignment film 29 having a light transmissivity. Further, although not illustrated in the drawing, the element substrate 2 includes a plurality of dummy pixel electrodes that surround the plurality of pixel electrodes 25 as viewed in plan view. Here, "light transmissivity" means a transmissivity with respect to a visible light, and preferably means that a transmissivity with respect to a visible light is equal to or more than 50%.

The first substrate 21, the laminated body 22, the plurality of pixel electrodes 25, and the first alignment film 29 are stacked in this order in the Z1 direction. The first substrate 21 is an example of a "substrate". The first substrate 21 is a flat plate having a light transmissivity and an insulating property. For example, the first substrate 21 is a glass substrate or a quartz substrate. The laminated body 22 includes a plurality of insulating layers having a light transmissivity, and various lines disposed between the plurality of insulating layers. The first substrate 21 and the laminated body 22 will be described later. Further, the pixel electrode 25 has a light transmissivity and conductivity. The pixel electrodes 25 are used for applying an electric field to the liquid crystal layer 5. For example, the pixel electrodes 25 each contains a transparent conductive material such as an Indium Tin Oxide (ITO), an Indium Zinc Oxide (IZO), or a Fluorine-doped Tin Oxide. The first alignment film 29 has a light transmissivity and an insulating property. The first alignment film 29 has a function of aligning liquid crystal molecules that the liquid crystal layer 5 includes. The first alignment film 29 is disposed so as to cover the plurality of pixel electrodes 25. For example, a material for forming the first alignment film 29 is a polyimide, a silicon oxide, or the like.

The counter substrate 3 is a substrate disposed so as to face the element substrate 2. The counter substrate 3 includes a second substrate 31 having a light transmissivity, an inorganic insulating layer 32 having a light transmissivity, a common electrode 33 having a light transmissivity, and a second alignment film 34 having a light transmissivity. Further, although not illustrated in the drawing, the counter substrate 3 includes a parting having light shielding property that surrounds the plurality of pixel electrodes 25 as viewed in plan view. In this embodiment, "light shielding property" means a light shielding property against a visible light, preferably means that a transmittance of a visible light is less than 50%, and more preferably means that the transmittance of a visible light is equal to or less than 10%.

The second substrate 31, the inorganic insulating layer 32, the common electrode 33, and the second alignment film 34 are stacked in this order in the Z2 direction. The second substrate 31 is a flat plate having a light transmissivity and an insulating property. For example, the second substrate 31 is a glass substrate or a quartz substrate. The inorganic insulating layer 32 has a light transmissivity and an insulating property, and is formed of an inorganic material containing silicon, such as a silicon oxide, for example. The common electrode 33 is a counter electrode disposed to face the plurality of pixel electrodes 25 via the liquid crystal layer 5. The common electrode 33 is used for applying an electric field to the liquid crystal layer 5. The common electrode 33 has a light transmissivity and a conductivity. For example, the common electrode 33 includes a transparent conductive material such as an ITO, an IZO, or an FTO. The second alignment film 34 has a light transmissivity and an insulating property. The second alignment film 34 has a function of aligning the liquid crystal molecules that the liquid crystal layer 5 includes. For example, a material for forming the second alignment film 34 is a polyimide, a silicon oxide, or the like, for example.

The sealing member 4 is disposed between the element substrate 2 and the counter substrate 3. The sealing member 4 is formed using an adhesive agent, or the like, containing various types of curable resin such as an epoxy resin, for example. The sealing member 4 may contain a gap material made of an inorganic material such as glass.

The liquid crystal layer 5 is disposed in a region surrounded by the element substrate 2, the counter substrate 3, and the sealing member 4. The liquid crystal layer 5 changes its optical property corresponding to an electric field. The liquid crystal layer 5 contains liquid crystal molecules having positive or negative dielectric anisotropy. The alignment of the liquid crystal molecules varies corresponding to a voltage applied to the liquid crystal layer 5.

As illustrated in FIG. 1, a plurality of scanning line driving circuits 11, a data line driving circuit 12, and a plurality of external terminals 13 are disposed on the element substrate 2. Although not illustrated in the drawing, some of the plurality of external terminals 13 are coupled to lines drawn from the scanning line driving circuits 11 or the data line driving circuit 12. Further, the plurality of external terminals 13 include terminals to which a common potential is applied. The terminals are electrically coupled to the common electrode 33 of the counter substrate 3 via lines and conductive materials not illustrated in the drawing.

The electro-optical device 100 includes a display region A10 for displaying an image, and a peripheral region A20 positioned outside the display region A10 as viewed in plan view. In the display region A10, a plurality of pixels P arranged in a matrix array are provided. The plurality of pixel electrodes 25 are provided for the plurality of pixels P such that one pixel electrode 25 is disposed in one pixel P. The common electrode 33 described above is provided in common with the plurality of pixels P. Further, the peripheral region A20 surrounds the display region A10 as viewed in plan view. The scanning line driving circuits 11 and the data line driving circuit 12 are disposed in the peripheral region A20.

In the present embodiment, the electro-optical device 100 is of a transmissive type. To be more specific, in the present embodiment, as illustrated in FIG. 2, light LL is incident on the counter substrate 3, and the light that is incident on the counter substrate 3 is modulated before the incident light is emitted from the element substrate 2 so that an image is displayed. Here, an image may be displayed by modulation of light incident on the element substrate 2 before the light incident on the element substrate 2 is emitted from the counter substrate 3.

Further, the electro-optical device 100 is applicable to a display device that performs color display, such as a personal computer and a smartphone described later, for example. When the electro-optical device 100 is applied to the display device, a color filter is used for the electro-optical device 100 when appropriate. Further, the electro-optical device 100 is applied to a projection-type projector described later, for example. In this case, the electro-optical device 100 functions as a light valve. Here, in this case, the color filter is omitted from the electro-optical device 100.

1B. Electrical Configuration of Element Substrate 2

Figure 3:
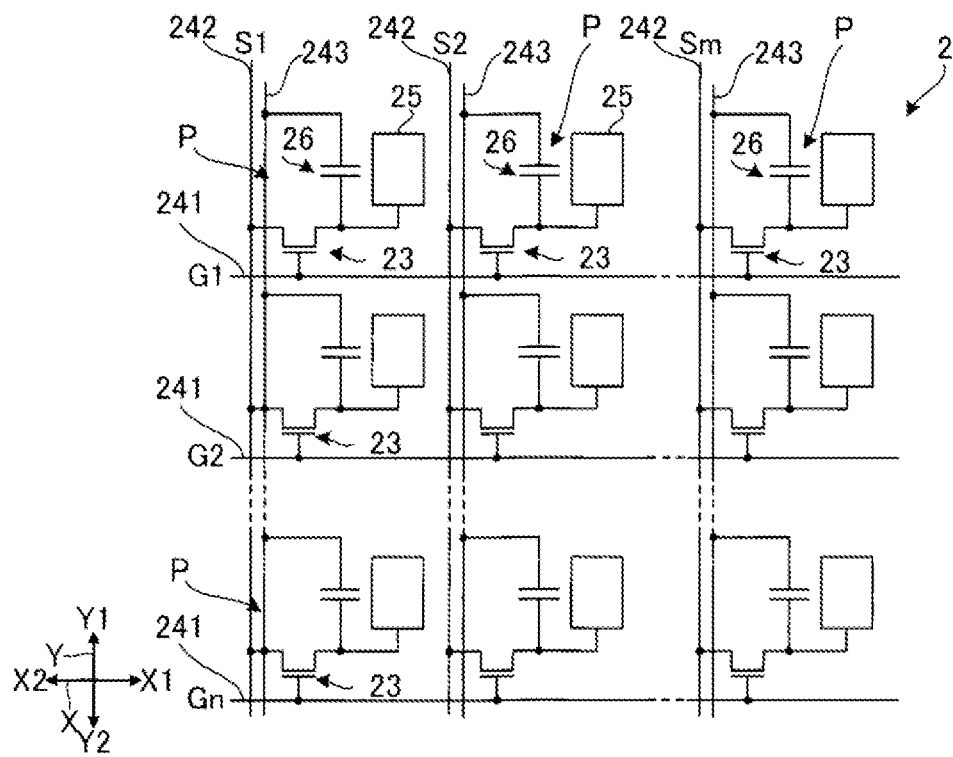
FIG. 3 is an equivalent circuit diagram illustrating an electrical configuration of an element substrate illustrated in FIG. 1.

FIG. 3 is an equivalent circuit diagram illustrating an electrical configuration of the element substrate 2 illustrated in FIG. 1. The laminated body 22 of the element substrate 2 includes a plurality of transistors 23, n pieces of scanning lines 241, m pieces of data lines 242, and n pieces of constant potential lines 243 illustrated in FIG. 3. Here, symbols n and m are integers of 2 or more. The transistors 23 are disposed corresponding to intersections where the n pieces of scanning lines 241 and the m pieces of data lines 242 intersect with each other. Each transistor 23 is a thin film transistor (TFT) that functions as a switching element, for example. Each transistor 23 includes a gate, a source, and a drain.

Each of the n pieces of scanning lines 241 extends in the X1 direction, and the n pieces of scanning lines 241 are arranged at equal intervals in the Y1 direction. Each of the n pieces of scanning lines 241 is electrically coupled to the gates of the corresponding plurality of transistors 23. The n pieces of scanning lines 241 are electrically coupled to the scanning line driving circuits 11 illustrated in FIG. 1. To the first to nth scanning lines 241, scanning signals G1, G2, . . . , Gn are line-sequentially supplied from the scanning line driving circuits 11.

Each of the m pieces of data lines 242 illustrated in FIG. 3 extends in the Y1 direction, and the m pieces of data lines 242 are arranged at equal intervals in the X1 direction. Each of the m pieces of data lines 242 is electrically coupled to the sources of the corresponding plurality of transistors 23. The m pieces of data lines 242 are electrically coupled to the data line driving circuit 12 illustrated in FIG. 1. To the first to mth data lines 242, image signals S1, S2, . . . , Sm are supplied in parallel from the data line driving circuit 12.

The n pieces of scanning lines 241 and the m pieces of data lines 242 illustrated in FIG. 3 are electrically insulated from each other, and are arranged in a lattice shape as viewed in plan view. A region surrounded by two scanning lines 241 disposed adjacent to each other and two data lines 242 disposed adjacent to each other corresponds to the pixel P. Each pixel electrode 25 is electrically coupled to the drain of the corresponding transistor 23.

Each of the n pieces of constant potential lines 243 extends in the Y1 direction, and the n pieces of constant potential lines 243 are arranged at equal intervals in the X1 direction. Further, the n pieces of constant potential lines 243 are electrically insulated from the m pieces of data lines 242 and the n pieces of scanning lines 241, and are disposed spaced apart from the data lines 242 and the scanning lines 241. To each constant potential line 243, a fixed potential such as a ground potential is applied. Each of the n pieces of constant potential lines 243 is a capacitance line electrically coupled to the corresponding capacitance element 26. Each capacitance element 26 is a retention capacitor for holding the potential of the pixel electrode 25, and is disposed overlapping with the transistor 23 as viewed in plan view. Here, the plurality of capacitance elements 26 are electrically coupled to the plurality of pixel electrodes 25 on a one-to-one basis. The plurality of capacitance elements 26 are electrically coupled to the drains of the plurality of transistors 23 on a one-to-one basis.

When the scanning signals G1, G2, Gn are sequentially activated and the n pieces of scanning lines 241 are sequentially selected, the transistors 23 coupled to the selected scanning line 241 are brought into an ON state. Then, the image signals S1, S2, Sm having magnitudes corresponding to the gray scale to be displayed are taken into the pixels P corresponding to the selected scanning line 241 via the m pieces of data lines 242, and are applied to the pixel electrodes 25. With such a configuration, a voltage corresponding to the gray scale to be displayed is applied to the liquid crystal capacitor formed between the pixel electrode 25 and the common electrode 33 illustrated in FIG. 2, and the alignment of the liquid crystal molecules is changed in accordance with the applied voltage. Further, the applied voltage is held by the capacitance element 26. Due to such a change in alignment of the liquid crystal molecules, the light is modulated so that the gray-scale display can be performed.

1C. Structure of Element Substrate 2

Figure 4:
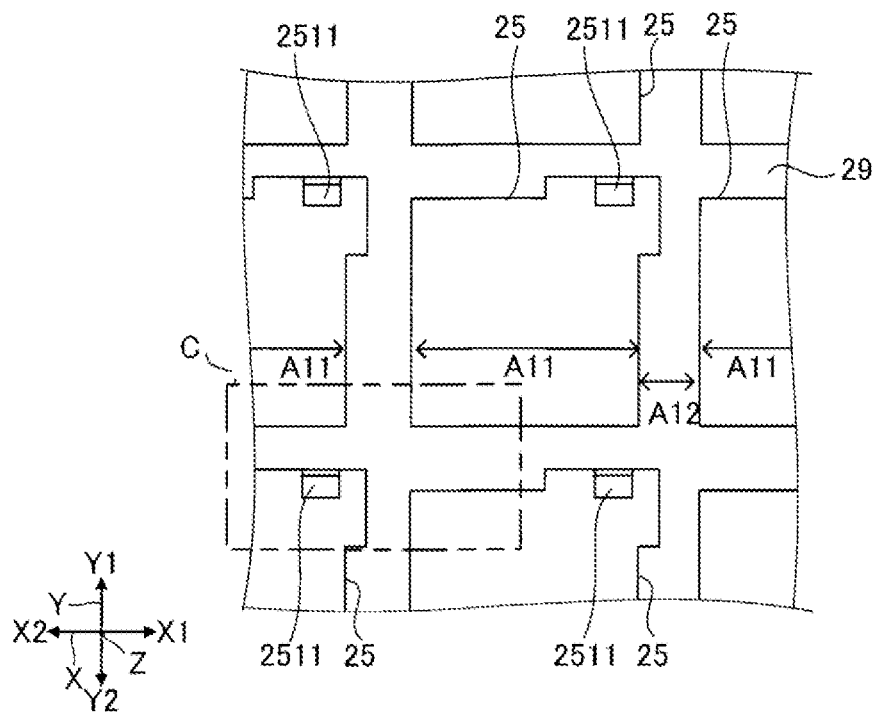
FIG. 4 is a plan view illustrating a portion of the element substrate illustrated in FIG. 2.

FIG. 4 is a plan view illustrating a portion of the element substrate 2 illustrated in FIG. 2. FIG. 4 illustrates a configuration corresponding to a configuration taken along a line B-B in FIG. 2, and illustrates a portion of the element substrate 2 in the display region A10. As illustrated in FIG. 4, the plurality of pixel electrodes 25 that the element substrate 2 includes are spaced apart from each other and arranged in a matrix array. A region where the pixel electrode 25 is disposed as viewed in plan view is an opening portion A11 that causes light to pass therethrough. The frame-shaped region located between the plurality of opening portions A11 as viewed in plan view is a light shielding region A12. In the light shielding region A12, the transistors 23, the capacitance elements 26, and various lines such as the scanning lines 241, the data lines 242, and the constant potential lines 243 illustrated in FIG. 3 described above are disposed. The pixel electrode 25 is coupled to the transistor 23 and the capacitance element 26 via a contact hole 2511.

Figure 5:
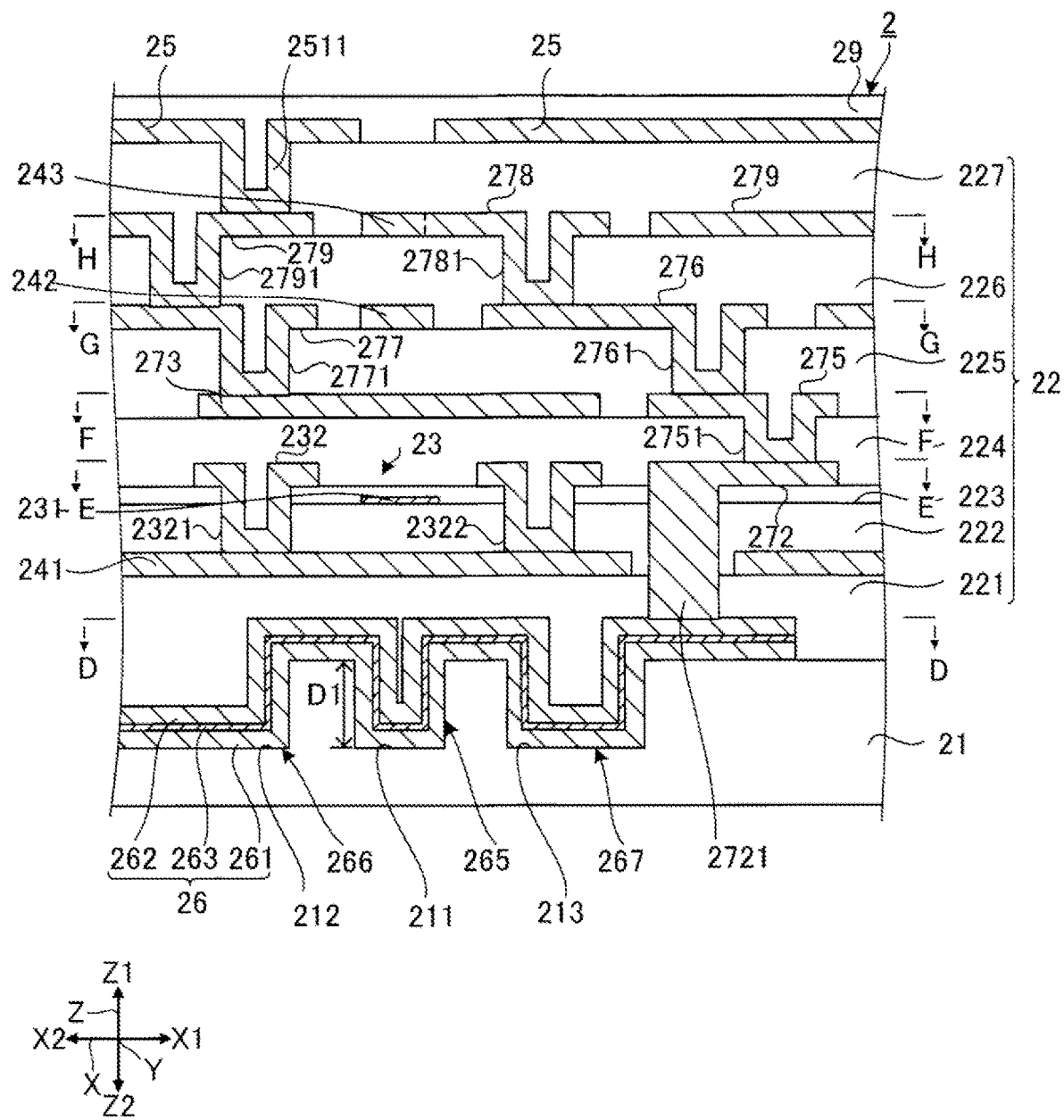
FIG. 5 is a cross-sectional view illustrating a portion of the element substrate illustrated in FIG. 2.
Figure 6:
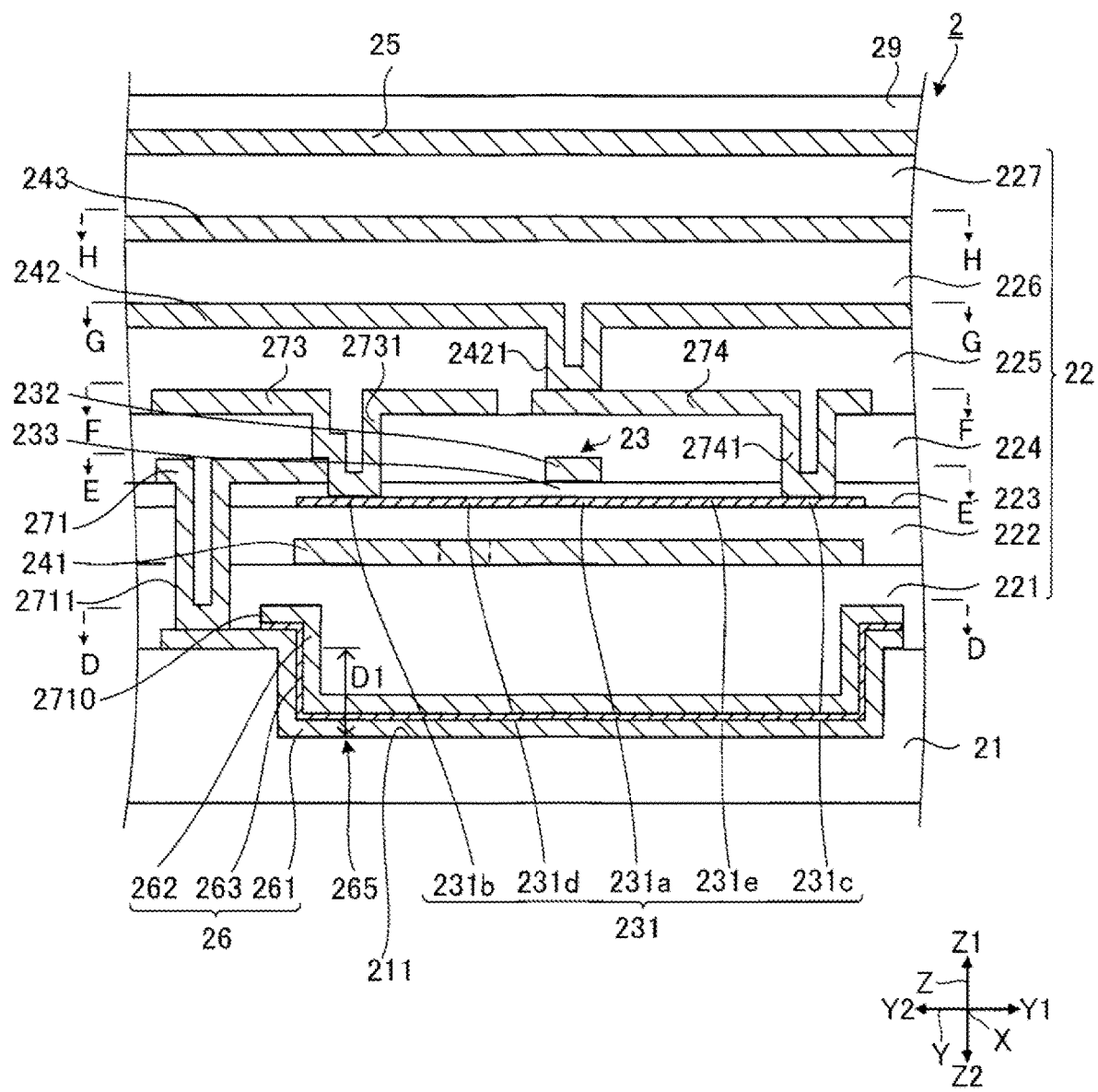
FIG. 6 is a cross-sectional view illustrating a portion of the element substrate illustrated in FIG. 2.

FIG. 5 and FIG. 6 are cross-sectional views illustrating a portion of the element substrate 2 illustrated in FIG. 2. FIG. 5 and FIG. 6 are cross-sectional views of a region C indicated by a double-dashed chain line in FIG. 4. FIG. 5 is a cross-sectional view mainly taken along an extension direction (X direction) of the scanning line 241, and FIG. 6 is a cross-sectional view mainly taken along an extension direction (Y direction) of the data line 242. The extension direction of the scanning line 241 is an example of the "first direction", and the extension direction of the data line 242 is an example of the "second direction".

As described above, the element substrate 2 includes the first substrate 21, the laminated body 22, the plurality of pixel electrodes 25, and the first alignment film 29. Hereinafter, the element substrate 2 will be described using FIG. 7 to FIG. 13 described later with reference to FIG. 5 and FIG. 6 illustrating cross-sectional configurations in the X direction and the Y direction.

As described above, the first substrate 21 illustrated in FIG. 5 and FIG. 6 is formed of a glass substrate or a quartz substrate, for example. The first substrate 21 has a first recessed portion 211, a second recessed portion 212, and a third recessed portion 213. The first recessed portion 211 is an example of a "recessed portion". Each of the first recessed portion 211, the second recessed portion 212, and the third recessed portion 213 is a recess formed in the first substrate 21, and the first to third recessed portions 211, 212, and 213 are formed for each transistor 23. The first recessed portion 211 is disposed in the Y direction along the data line 242, and the second recessed portion 212 and the third recessed portion 213 are disposed apart from the first recessed portion 211 in the X direction along the scanning line 241. Here, in the present embodiment, depths in the Z2 direction of the first recessed portion 211, the second recessed portion 212, and the third recessed portion 213 are equal to each other.

Figure 7:
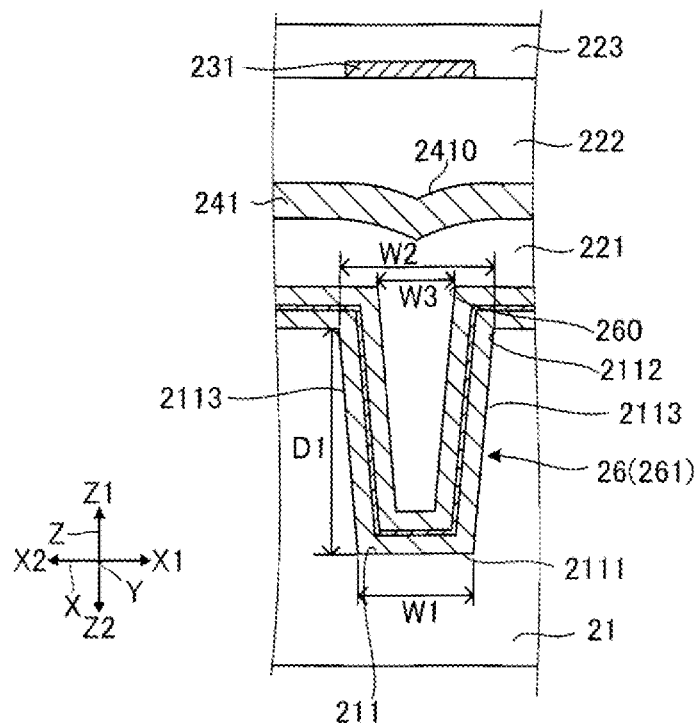
FIG. 7 is an enlarged cross-sectional view of a first recessed portion illustrated in FIG. 5.

FIG. 7 is an enlarged cross-sectional view of the first recessed portion 211 illustrated in FIG. 5. The first recessed portion 211 has a shape in which a surface of the first substrate 21 is opened. The first recessed portion 211 includes a bottom surface 2111 in the Z2 direction, and side surfaces 2113 that face each other. The first recessed portion 211 has an elongated shape as viewed in plan view, and has a width in the X direction and a length in the Y direction (see FIG. 8). A distance between the surface of the first substrate 21 and the bottom surface 2111 in the Z2 direction is a depth D1 of the first recessed portion 211. Further, the depth D1 is a length from the opening 2112 to the bottom surface 2111 in the Z1 direction. The width W1 is a length of the bottom surface 2111 in the X1 direction. Further, a width W2 is a length of the opening 2112 in the X1 direction. The depth D1 of the first recessed portion 211 is larger than the width W1 of the bottom surface 2111 of the first recessed portion 211. The bottom surface 2111 is a surface along an X-Y plane. Further, the depth D1 is larger than the width W2 of the opening 2112 of the first recessed portion 211. A distance of an opening when the capacitance element 26 is formed in the first recessed portion 211 is a width W3.

Further, a ratio (D1/W1) of the depth D1 and the width W1 of the first recessed portion 211 is preferably equal to or more than 1.5, for example. Further, a ratio (D1/W2) of the depth D1 and the width W2 is equal to or more than 1.4, for example.

The depth D1 is in a range of from 0.5 μm or more to 2.0 μm or less, depending on the characteristic and ease of formation of the capacitance element 26. The width W1 is in a range of from 0.2 μm or more to 1.0 μm or less, for example. The width W2 is in a range of from 0.3 μm or more to 1.5 μm or less, for example.

Figure 8:
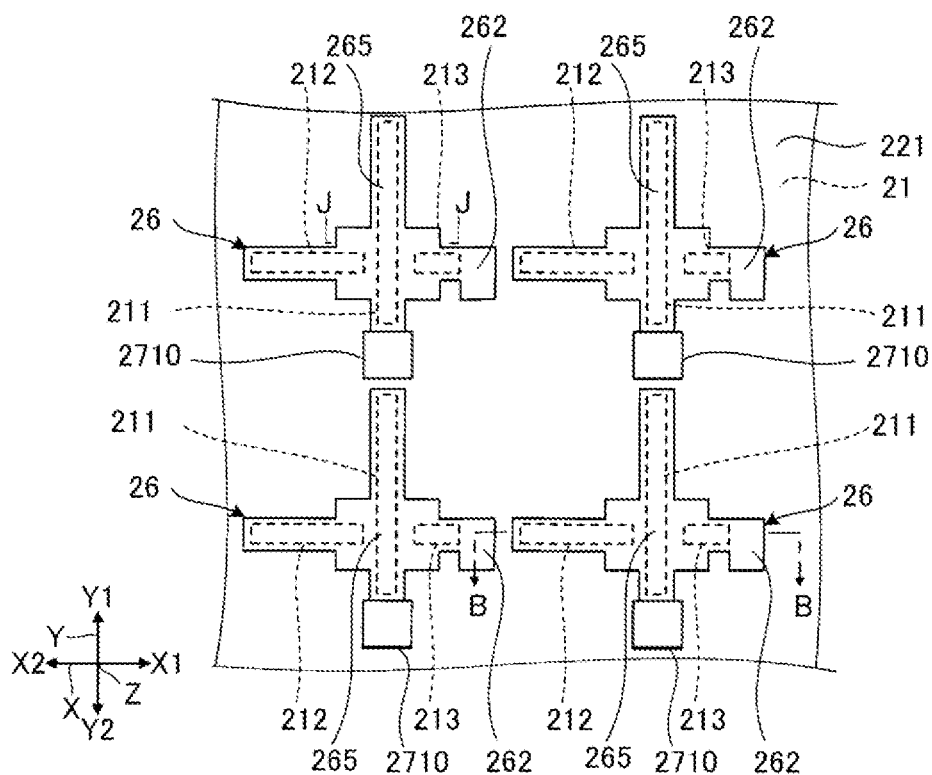
FIG. 8 is a plan view illustrating a configuration corresponding to a line D-D in FIG. 5 and FIG. 6.

FIG. 8 is a plan view illustrating a configuration corresponding to a line D-D in FIG. 5 and FIG. 6. In FIG. 8, a laminated film including a first conducive layer 261, a dielectric layer 263, and a second conductive layer 262, and an insulating layer 221 are formed on the surface of the first substrate 21 including the first recessed portion 211, the second recessed portion 212, and the third recessed portion 213. The first recessed portion 211 has an elongated shape extending in the Y1 direction as viewed in plan view. The second recessed portion 212 extends in the X2 direction, and the third recessed portion 213 extends in the X1 direction respectively. The first recessed portion 211 is positioned between the second recessed portion 212 and the third recessed portion 213 in a spaced-apart manner as viewed in plan view.

The capacitance element 26 is disposed on the first substrate 21. The capacitance element 26 includes the first conductive layer 261, the dielectric layer 263, and the second conductive layer 262. The first conductive layer 261, the dielectric layer 263, and the second conductive layer 262 are stacked in this order in the Z1 direction. The first conductive layer 261 is in contact with the first substrate 21. The dielectric layer 263 is disposed between the first conductive layer 261 and the second conductive layer 262. A film formed by stacking the first conductive layer 261, the dielectric layer 263, and the second conductive layer 262 in this order in the Z1 direction is an example of a "laminated film". Here, the first conductive layer 261 and the first substrate 21 may be provided with a light transmitting layer.

The capacitance element 26 has a portion extending in the Y direction, a portion extending in the X direction, and an intersection portion where these portions intersect with each other. Further, the capacitance element 26 overlaps with the first recessed portion 211, the second recessed portion 212, and the third recessed portion 213 as viewed in plan view. Specifically, the capacitance element 26 covers the first recessed portion 211, the second recessed portion 212, and the third recessed portion 213 with a wide width. On one end of the capacitance element 26 in the Y2 direction, in order to electrically couple the first conductive layer 261, the pixel electrode 25, and the like to each other, a notched portion 2710 is formed in the dielectric layer 263 and the second conductive layer 262. The notched portion 2710 and the first recessed portion 211 do not overlap with each other as viewed in plan view. Further, a portion of the capacitance element 26 on one end in the X1 direction where the second conductive layer 262 and the constant potential line 243 are electrically coupled to each other does not overlap with the second recessed portion 212 and the third recessed portion 213 as viewed in plan view.

The capacitance element 26 is partially disposed in the first recessed portion 211, the second recessed portion 212, and the third recessed portion 213 respectively. The capacitance element 26 is formed along a shape of a surface of the first substrate 21 in the Z1 direction. Accordingly, the capacitance element 26 is formed along respective shapes of the first recessed portion 211, the second recessed portion 212, and the third recessed portion 213. The first conductive layer 261, the dielectric layer 263, and the second conductive layer 262 are formed, in this order, on the surface of the first substrate 21, the bottom surface 2111, and the side surfaces 2113 with uniform film thickness whereby the stable capacitance element 26 can be formed.

The capacitance element 26 includes a first element portion 265, a second element portion 266, and a third element portion 267. The first element portion 265 is a portion disposed in the first recessed portion 211, and corresponds to a "trench portion". The second element portion 266 is a portion disposed in the second recessed portion 212. The third element portion 267 is a portion disposed in the third recessed portion 213.

As a material for forming the first conductive layer 261 and the second conductive layer 262, although a conductive polysilicon film having a low light shielding property is preferable, for example, metal such as titanium, a metal oxide, or a metal nitride may also be used. The material is polysilicon, for example, the polysilicon contains a dopant such as phosphorus (P). Further, as a material for forming the dielectric layer 263, although a silicon nitride film having a low light shielding property and a high dielectric constant is desirable, for example, a metal oxide film such as an aluminum oxide film, a hafnium oxide film, a silicon oxide film, or the like, a metal nitride film such as a silicon nitride film, or the like, or a multilayer film formed by stacking these metal oxide film and the metal nitride film may be used.

Film thicknesses of the first conductive layer 261 and the second conductive layer 262 are in a range of from 0.03 μm to 0.2 μm, for example. A film thickness of the dielectric layer 263 is in a range of from 0.01 μm to 0.03 μm, for example. A thickness of the laminated film is in a range of from 0.13 μm to 0.26 μm, for example. The first conductive layer 261, the dielectric layer 263, and the second conductive layer 262 can be formed collectively. As the configuration of the laminated film, it is sufficient that the laminated film is uniformly formed along a shape of the first recessed portion 211 so that the capacitance element 26 having a stable characteristic can be formed. Further, it is preferable that the film thickness of the second conductive layer 262 disposed on an upper side be larger than the film thickness of the first conductive layer 261 disposed on a lower side.

As illustrated in FIG. 7, the width W3 of an opening 260 of the first element portion 265 that the capacitance element 26 includes is smaller than the depth D1 of the first recessed portion 211. In the example illustrated in the drawing, the width W3 is smaller than the width W1 of the first recessed portion 211. However, the width W3 may be equal to or larger than the width W1 depending on an inclination angle or the like of the side surfaces 2113 of the first recessed portion 211 with respect to the bottom surface 2111. Here, the width W3 is a length of the opening 260 of the first element portion 265 in the X1 direction. Further, each of the widths W1, W2, and W3 described above may be equal to or more than the depth D1.

The laminated body 22 is disposed on the first substrate 21 so as to cover the capacitance element 26. The laminated body 22 includes a plurality of insulating layers 221, 222, 223 224, 225, 226, and 227 that are aligned in the Z1 direction. The insulating layers 221 to 227 each have a light transmissivity and an insulating property. For example, as materials for forming the respective insulating layers 221 to 227, an inorganic material containing silicon such as a silicon oxide or a silicon nitride is used. The insulating layer 221 and the insulating layer 222 constitute an "insulating film". The insulating layer 221 is an example of a "first insulating film", the insulating layer 222 is an example of a "second insulating film", and the insulating layer 224 is an example of a "third insulating film". The insulating layer 221 and the insulating layer 222 are formed with a film thickness of from 0.2 μm to 0.6 μm, for example. The recessed regions of the first substrate 21 are filled with the insulating layer 221 and hence, a thickness of the insulating layer 221 in the Z2 direction at the recessed regions is increased.

A plurality of lines and the like are disposed in the laminated body 22. Specifically, the transistor 23, the scanning line 241, the data line 242, the constant potential line 243, and the capacitance element 26 are disposed in the laminated body 22. Further, relay electrodes 271, 272, 273, 274, 275, 276, 277, 278, and 279 for coupling the respective lines to each other are disposed in the laminated body 22. The transistor 23 includes a gate electrode 232 and a semiconductor layer 231, and the relay electrode 273 as the drain electrode and the relay electrode 274 as the source electrode are respectively coupled to the semiconductor layer 231. The relay electrode 273 is an example of a "drain electrode", and the relay electrode 274 is an example of a "source electrode".

The insulating layer 221 is disposed on the first substrate 21 so as to cover the capacitance element 26, and is disposed so as to fill respective spaces in the first recessed portion 211, the second recessed portion 212, and the third recessed portion 213. Accordingly, the inside of the first recessed portion 211, the inside of the second recessed portion 212, and the inside of the third recessed portion 213 are filled with the insulating layer 221, and the thickness of the insulating layer 221 in the Z direction in each space is thicker than the thickness in other regions. The insulating layer 221 can be formed in a shape illustrated in FIG. 7 in accordance with the shape of the first recessed portion 211 and the like and a forming condition of the insulating layer 221. However, a planarization treatment such as a CMP method may be applied to a surface of the insulating layer 22 on a side opposite to the first substrate 21.

The scanning line 241 is disposed on the insulating layer 221. The scanning line 241 is an example of a "light shielding film". The scanning line 241 has a light shielding property and a conductivity. Further, as illustrated in FIG. 7, the scanning line 241 includes a portion 2410 that is recessed toward the first element portion 265 of the capacitance element 26. A portion of the scanning line 241 is formed above the first recessed portion 211 and hence, the portion 2410 is formed due to an influence of the first recessed portion 211. Here, a surface of the insulating layer 221 in the Z1 direction also has a portion recessed toward the first element portion 265.

The insulating layer 222 is disposed on the scanning line 241. As illustrated in FIG. 7, a surface of the insulating layer 222 in the Z1 direction is a flat surface. By stacking the insulating layer 222, the influence of the first recessed portion 211 is alleviated. As a result, the surface of the insulating layer 222 in the Z1 direction becomes a flat surface.

The semiconductor layer 231 is disposed on the insulating layer 222 so that the transistor 23 is disposed. The transistor 23 includes the semiconductor layer 231, the gate electrode 232, and a gate insulating film 233. The gate electrode 232 is disposed on the insulating layer 223. The gate insulating film 233 is interposed between the gate electrode 232 and a channel region 231a of the semiconductor layer 231. A region of the insulating layer 223 corresponding to the gate electrode 232 corresponds to the gate insulating film 233.

The semiconductor layer 231 has a Lightly Doped Drain (LDD) structure. Specifically, the semiconductor layer 231 includes the channel region 231a, a drain region 231b, a source region 231c, a low concentration drain region 231d, and a low concentration source region 231e. The channel region 231a is positioned between the drain region 231b and the source region 231c. The low concentration drain region 231d is positioned between the channel region 231a and the drain region 231b. The low concentration source region 231e is positioned between the channel region 231a and the source region 231c. The semiconductor layer 231 is formed of polysilicon, for example. A region excluding the channel region 231a is doped with a dopant for increasing conductivity. A concentration of a dopant in the low concentration drain region 231d is lower than a concentration of the dopant in the drain region 231b. A concentration of the dopant in the low concentration source region 231e is lower than a concentration of the dopant in the source region 231c. Here, for example, the low concentration source region 231e may be omitted.

For example, the gate insulating film 233 is formed of a silicon oxide film formed by thermal oxidation or a CVD (chemical vapor deposition) method, for example. For example, the gate electrode 232 is formed by doping polysilicon with a dopant for increasing conductivity. Here, the gate electrode 232 may be formed using a material having conductivity such as metal, a metal oxide, and a metal compound.

Further, the gate electrode 232 is disposed in contact holes 2321, 2322 for coupling the gate electrode 232 to the scanning line 241. The contact holes 2321, 2322 penetrate the insulating layers 222 and 223 respectively, and reach the scanning line 241. Further, on the insulating layer 223, in addition to the gate electrode 232, a portion of the relay electrode 272 is disposed. The relay electrode 272 is disposed in a contact hole 2721 for coupling the relay electrode 272 to the second conductive layer 262 of the capacitance element 26. The contact hole 2721 penetrates the insulating layers 221 to 223, and reaches the second conductive layer 262. The relay electrode 272 is positioned away from the gate electrode 232 in the X1 direction as viewed in plan view. A portion of the relay electrode 272 overlaps with the scanning line 241 as viewed in plan view. Further, a portion of the relay electrode 271 is disposed on the insulating layer 223. The relay electrode 271 is disposed in a contact hole 2711 for coupling the relay electrode 271 to the first conductive layer 261 of the capacitance element 26. The contact hole 2711 penetrates the insulating layers 221 to 223, and reaches the first conductive layer 261. The relay electrode 271 is positioned away from the gate electrode 232 in the Y2 direction as viewed in plan view.

Figure 9:
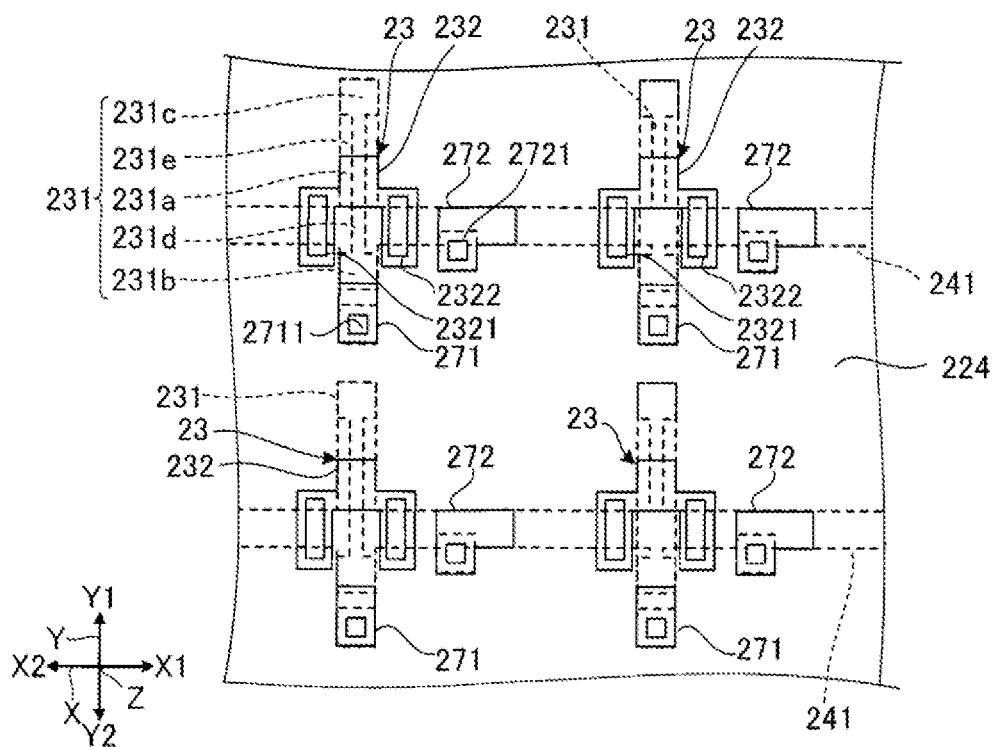
FIG. 9 is a plan view illustrating a configuration corresponding to a line E-E in FIG. 5 and FIG. 6.

FIG. 9 is a plan view illustrating a configuration corresponding to a line E-E in FIG. 5 and FIG. 6. The scanning line 241, the insulating layer 222, the semiconductor layer 231, the insulating layer 223, the gate electrode 232, the relay electrodes 271, 272, and the insulating layer 224 are formed on the insulating layer 221 in FIG. 8.

As viewed in plan view, in the semiconductor layer 231, the drain region 231b, the low concentration drain region 231d, the channel region 231a, the low concentration source region 231e, and the source region 231c are disposed in this order along the Y1 direction. The width of the semiconductor layer 231 in the X direction is 0.3 µm, for example. The semiconductor layer 231 has an elongated shape extending linearly in the Y direction as viewed in plan view. Here, a drain electrode forming region of the drain region 231b and a source electrode forming region of the source region 231c may be formed with a wide width respectively.

For example, the scanning line 241 extends in the X direction as viewed in plan view with a width of from 0.5 µm to 1 µm. Further, the scanning line 241 overlaps with the semiconductor layer 231 at a wide width portion thereof, and includes a protruding portion extending in the Y1 direction and the Y2 direction from the wide width portion. The wide width portion and the protruding portion cover the semiconductor layer 231 with a wide width from a first substrate 21 side. Further, the scanning line 241 is electrically coupled to the gate electrode 232 at the wide width portion via the contact holes 2321, 2322.

The gate electrode 232 overlaps with the channel region 231a of the semiconductor layer 231 as viewed in plan view. Further, as viewed in plan view, the low concentration drain region 231d is positioned between the contact holes 2321, 2322 in which the gate electrode 232 is disposed, and the low concentration drain region 231d overlaps with the scanning line 241. With such a configuration, the low concentration drain region 231d is shielded from light on both sides in the X direction and light from a Z2 direction side.

Figure 10:
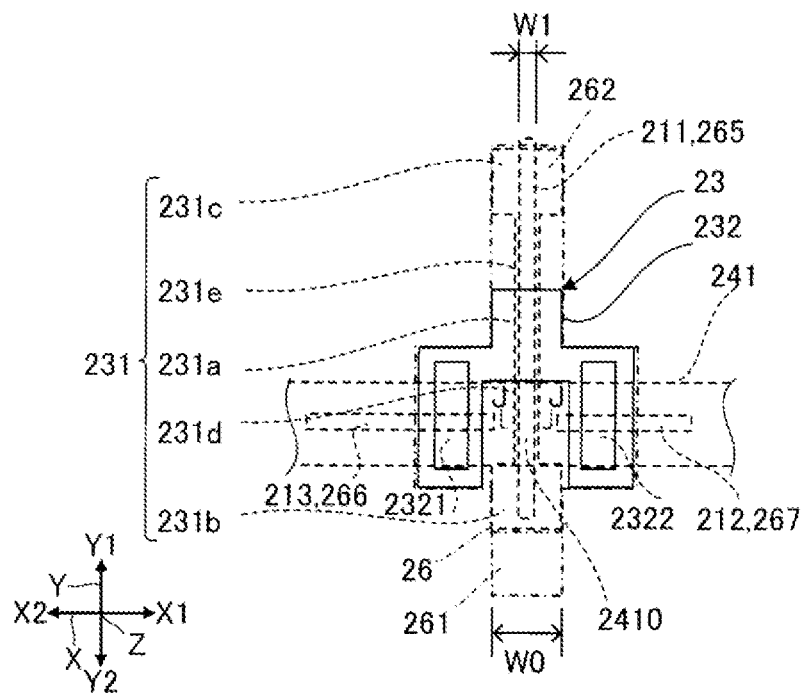
FIG. 10 is a view illustrating a planar positional relationship of a first recessed portion, a first element portion, a scanning line, a semiconductor layer, and a gate electrode.

FIG. 10 is a view illustrating a planar positional relationship of the first recessed portion 211, the first element portion 265, the scanning line 241, the semiconductor layer 231, and the gate electrode 232. Here, FIG. 7 is a cross-sectional view illustrating a configuration corresponding to a line J-J in FIG. 10.

The first recessed portion 211 is disposed along the semiconductor layer 231, and overlaps with the semiconductor layer 231, as viewed in plan view. Accordingly, the first element portion 265 of the capacitance element 26 illustrated in FIG. 8 is disposed along the semiconductor layer 231, and overlaps with the semiconductor layer 231, as viewed in plan view. Further, the portion 2410 of the scanning line 241 overlaps with the first recessed portion 211, the first element portion 265, and the low concentration drain region 231d as viewed in plan view.

Further, in the example illustrated in the drawing, the width W1 of the bottom surface 2111 of the first recessed portion 211 is equal to or less than a width W0 of the source region 231c of the semiconductor layer 231. Here, the width W1 may be larger than the width W0. The width W0 is a length along the X1 direction. The width W0 of the source region 231c and a width of the drain region 231b are equal. Further, in the example illustrated in the drawing, the width W1 of the bottom surface 2111 of the first recessed portion 211 is smaller than a width of the channel region 231a. However, the width W1 may be equal to or more than the width of the channel region 231a. Although not illustrated in detail in the drawing, the width W3 of the opening 260 of the first element portion 265 is equal to or less than the width W0 of the source region 231c. Here, the width W3 may be larger than the width W0.

As illustrated in FIG. 9, on the insulating layer 223, in addition to the gate electrode 232, the portion of the relay electrode 272 is disposed.

The relay electrode 271 extends in the Y1 direction, and is coupled to the relay electrode 273. The relay electrode 271 disposed in the contact hole 2711 can shield the low-concentration drain region 231d and the drain region 231b of the semiconductor layer 231 from light advancing in the Y1 direction including an oblique direction.

Figure 11:
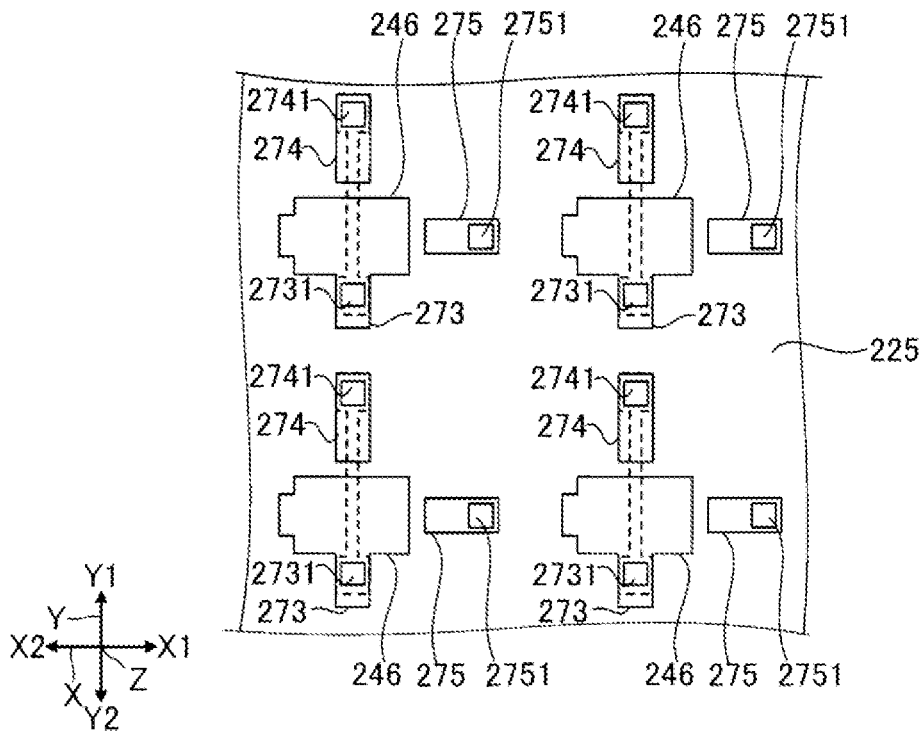
FIG. 11 is a plan view illustrating a configuration corresponding to a line F-F in FIG. 5 and FIG. 6.

FIG. 11 is a plan view illustrating a configuration corresponding to a line F-F in FIG. 5 and FIG. 6. The insulating layer 225 is formed so as to cover the relay electrodes 273, 274, and 275. The relay electrode 273 overlaps with a portion of the semiconductor layer 231 as viewed in plan view. Further, the relay electrode 274 overlaps with a portion of the semiconductor layer 231 as viewed in plan view, and is disposed away from the relay electrode 273 in the Y1 direction. Further, the relay electrode 275 is disposed away from the relay electrode 273 in the X1 direction as viewed in plan view.

The relay electrode 273 extends in the Y1 direction, and includes a wide width portion 246 that overlaps with the drain region 231b and the low concentration drain region 231d of the semiconductor layer 231.

A portion of the relay electrode 275 is disposed on the insulating layer 224. The relay electrode 275 is disposed in a contact hole 2751 for coupling the relay electrode 275 to the relay electrode 272. The contact hole 2751 penetrates the insulating layer 224 and reaches the relay electrode 272.

Further, a portion of the relay electrode 273 and a portion of the relay electrode 274 are disposed on the insulating layer 224. The relay electrode 273 is disposed in a contact hole 2731 for coupling the relay electrode 273 to the drain region 231b of the semiconductor layer 231 and the relay electrode 271. The contact hole 2731 penetrates the insulating layers 223, 224, and reaches the drain region 231b. Further, a portion of the contact hole 2731 penetrates the insulating layer 224, and reaches the relay electrode 271. Further, the relay electrode 274 is disposed in a contact hole 2741 for coupling the relay electrode 274 to the source region 231c of the semiconductor layer 231. The contact hole 2741 penetrates the insulating layers 223, 224, and reaches the source region 231c. The relay electrode 273 can shield the low-concentration drain region 231d and the drain region 231b of the semiconductor layer 231 from light advancing in the Z2 direction including an oblique direction by the wide width portion 246 and the portion of the relay electrode 273 in the contact hole 2731.

The insulating layer 225 is formed so as to cover the relay electrodes 273, 274, and 275.

Figure 12:
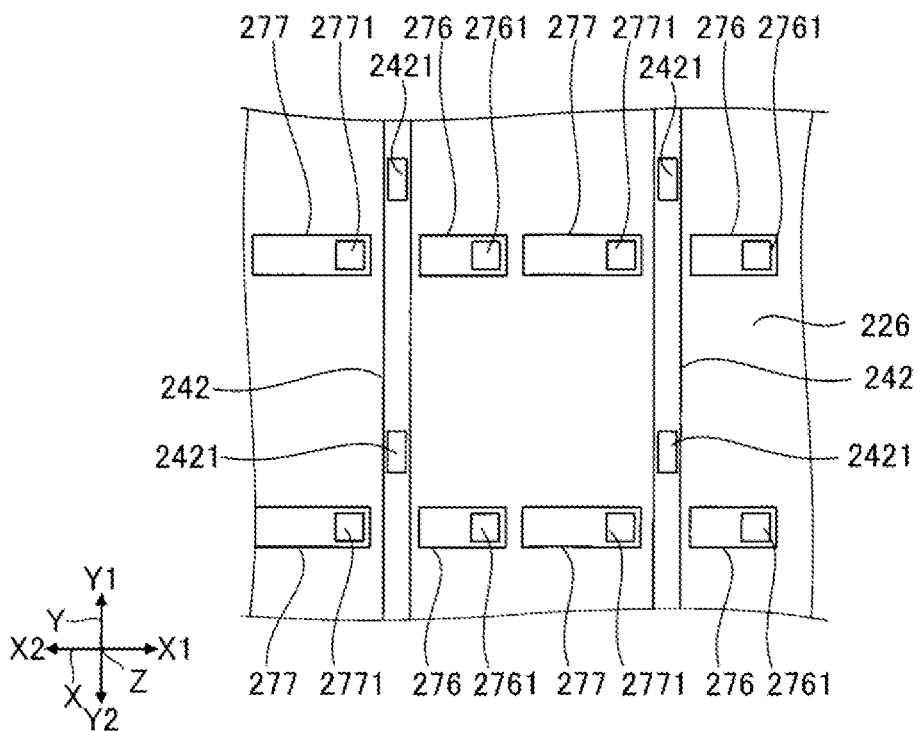
FIG. 12 is a plan view illustrating a configuration corresponding to a line G-G in FIG. 5 and FIG. 6.

FIG. 12 is a plan view illustrating a configuration corresponding to a line G-G in FIG. 5 and FIG. 6, wherein the data line 242 and the relay electrodes 276, 277 are formed on the insulating layer 225. As illustrated in FIG. 12, the relay electrode 276 is disposed away from the corresponding data line 242 in the X1 direction as viewed in plan view. The relay electrode 277 is disposed away from the corresponding data line 242 in the X2 direction as viewed in plan view. The data lines 242 extends in the Y direction, and overlaps with the semiconductor layer 231 as viewed in plan view. For example, the width of the data line 242 is in a range of from 0.5 μm to 1 μm.

A portion of the relay electrode 276, a portion of the relay electrode 277, and the data line 242 are disposed on the insulating layer 225.

The relay electrode 276 is disposed in a contact hole 2761 for coupling the relay electrode 276 to the relay electrode 275. The contact hole 2761 penetrates the insulating layer 225, and reaches the relay electrode 275. Further, the relay electrode 277 is disposed in a contact hole 2771 for coupling the relay electrode 277 to the relay electrode 273. The contact hole 2771 penetrates the insulating layer 225, and reaches the relay electrode 273.

The data line 242 is disposed in a contact hole 2421 for coupling the data line 242 to the relay electrode 274. The contact hole 2421 penetrates the insulating layer 225, and reaches the relay electrode 274. The data line 242 is electrically coupled to the source region 231c of the semiconductor layer 231 via the relay electrode 274.

The insulating layer 226 is formed so as to cover the data line 242 and the relay electrodes 276, 277.

Figure 13:
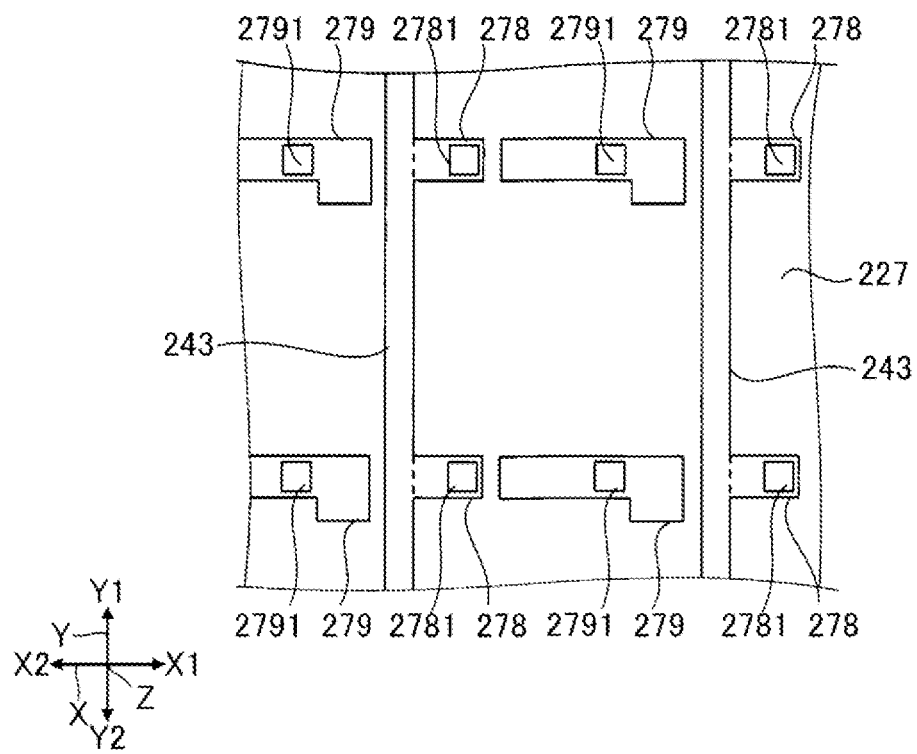
FIG. 13 is a plan view illustrating a configuration corresponding to a line H-H in FIG. 5 and FIG. 6.

FIG. 13 is a plan view illustrating a configuration corresponding to a line H-H in FIG. 5 and FIG. 6, wherein the constant potential line 243 and the relay electrodes 278, 279 are disposed on the insulating layer 226. The relay electrode 278 is disposed so as to protrude in the X1 direction with respect to the corresponding constant potential line 243, and is coupled to the constant potential line 243 as viewed in plan view. The relay electrode 279 is disposed away from the corresponding constant potential line 243 in the X2 direction as viewed in plan view. The constant potential line 243 extends in the Y direction with a width of from 0.5 μm to 1 μm, and overlaps with the data line 242 and the semiconductor layer 231 respectively as viewed in plan view, for example.

The insulating layer 227 is disposed so as to cover the constant potential line 243 and the relay electrodes 278, 279.

A portion of the relay electrode 278, a portion of the relay electrode 279, and the constant potential line 243 are disposed on the insulating layer 226. Here, the relay electrode 278 is formed integrally with the constant potential line 243.

The relay electrode 278 is disposed in a contact hole 2781 for coupling the relay electrode 278 to the relay electrode 276. The contact hole 2781 penetrates the insulating layer 226, and reaches the relay electrode 276. The constant potential line 243 is electrically coupled to the second conductive layer 262 of the capacitance element 26 via the relay electrodes 278, 276, 275, and the relay electrode 272.

The relay electrode 279 is disposed in a contact hole 2791 for coupling the relay electrode 279 to the relay electrode 277. The contact hole 2791 penetrates the insulating layer 226, and reaches the relay electrode 277.

The insulating layer 227 is formed so as to cover the constant potential line 243 and the relay electrodes 278, 279.

As illustrated in FIG. 4, the pixel electrode 25 is disposed on the insulating layer 227. The pixel electrode 25 is disposed in a contact hole 2511 for coupling the pixel electrode 25 to the relay electrode 279. The contact hole 2511 is formed along an inner wall surface of a contact hole that penetrates the insulating layer 227 and reaches the relay electrode 279. The pixel electrode 25 is electrically coupled to the drain region 231b of the semiconductor layer 231 via the relay electrodes 279, 277 and the relay electrode 273, and is electrically coupled to the first conductive layer 261 of the capacitance element 26 via the relay electrodes 279, 277, 273 and the relay electrode 271. Further, the first conductive layer 261 of the capacitance element 26 is electrically coupled to the drain region 231b of the semiconductor layer 231 via the relay electrodes 273, 271.

Further, as the respective materials for forming the scanning line 241, the data line 242, and the constant potential line 243 described above, for example, metal such as tungsten (W), titanium (Ti), chromium (Cr), iron (Fe), aluminum (Al), and the like, or a metal material such as a metal nitride such as a titanium nitride or a metal oxide such as a tungsten silicide can be named. The scanning line 241, the data line 242, and the constant potential line 243 are respectively formed of a single layer made of a metal material or laminated layers made of metal materials. Further, the relay electrodes 271, 272 are formed of the same material as the gate electrode 232, the relay electrodes 276, 277 are formed of the same material as the data line 242, and the relay electrodes 278, 279 are formed of the same material as the constant potential line 243. Further, the relay electrodes 273, 274, and 275 are also formed of substantially the same material as described above. For example, the scanning line 241 is formed of a tungsten silicide film, and is formed with a film thickness of from 0.1 μm to 0.4 μm. Further, the data line 242 and the constant potential line 243 are formed with a film thickness of from 0.3 μm to 0.6 μm.

In the above-mentioned description, the configuration of the various lines and the like included in the element substrate 2 is one example, and is not limited to the configuration illustrated in FIG. 5 and FIG. 6. For example, the scanning line 241 may be formed above the transistor 23. In this case, a light shielding film having a light shielding property other than the scanning line 241 is disposed between the capacitance element 26 and the transistor 23. It is sufficient for the light shielding film to have the light shielding property and hence, the light shielding film may be formed of a line or may be formed of a conductive film insulated from a line.

1D. Method of Manufacturing Element Substrate 2.

Figure 14:
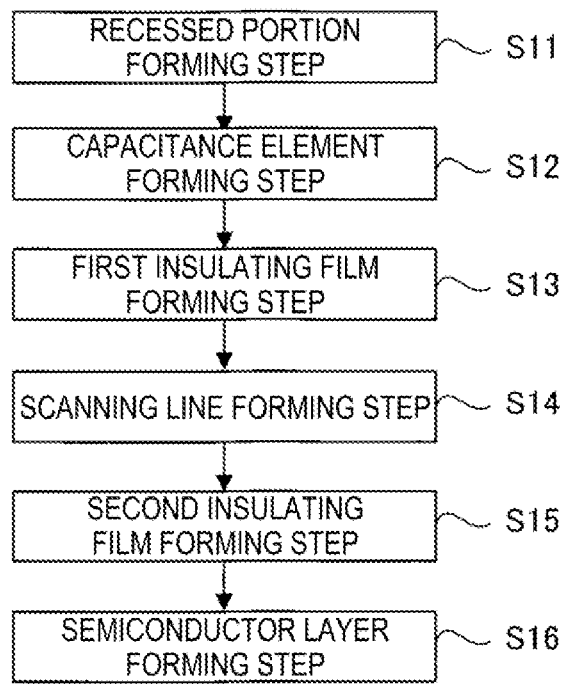
FIG. 14 is a block diagram illustrating a flow of a method of manufacturing a portion of the element substrate.

FIG. 14 is a block diagram illustrating the flow of a method of manufacturing a portion of the element substrate 2. In the method of manufacturing the element substrate 2 included in the electro-optical device 100, methods of manufacturing the first recessed portion 211, the capacitance element 26, the scanning line 241, and the semiconductor layer 231 are mainly described.

The method of manufacturing the element substrate 2 includes a recessed portion forming step S1l, a capacitance element forming step S12, a first insulating film forming step S13, a scanning line forming step S14, a second insulating film forming step S15, and a semiconductor layer forming step S16.

Figure 15:
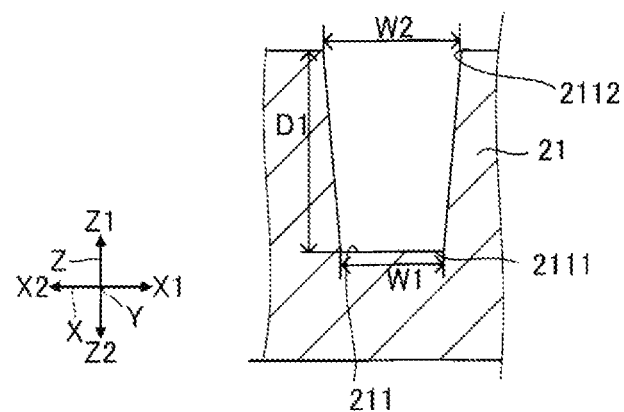
FIG. 15 is a view for explaining a recessed portion forming step.

FIG. 15 is a view for explaining the recessed portion forming step S1l. In the recessed portion forming step S1l, as illustrated in FIG. 5, FIG. 6, and FIG. 8, the first substrate 21 having the first recessed portions 211 is formed. Here, in addition to the first recessed portions 211, the second recessed portions 212 and the third recessed portions 213 are also formed. For example, the first recessed portion 211 is formed in such a manner that a mask not illustrated in the drawing is formed on a quartz substrate, and the quartz substrate is etched by anisotropic etching via the mask. Further, for example, the first recessed portion 211 is formed such that an aspect ratio (D1/W1) of the first recessed portion 211 becomes larger than 1.

Figure 16:
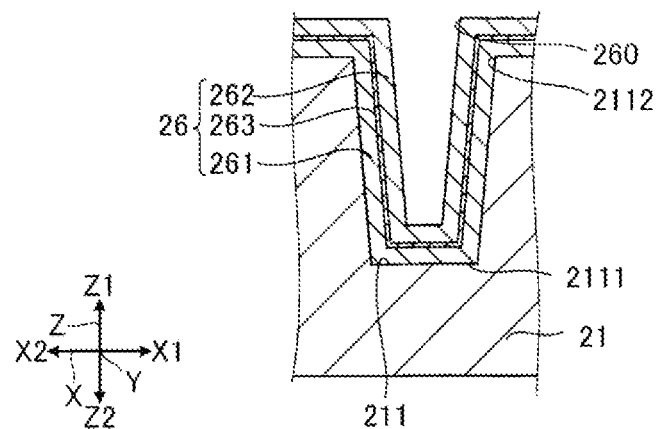
FIG. 16 is a view for explaining a capacitance element forming step.

FIG. 16 is a view for explaining the capacitance element forming step S12. As illustrated in FIG. 5, FIG. 6 and FIG. 8, in the capacitance element forming step S12, the capacitance element 26 is formed along a surface of the first substrate 21 including the first recessed portion 211 in the Z1 direction. Specifically, for example, first, the first conductive layer 261 formed of a polysilicon film containing a dopant such as phosphorus is formed along the first recessed portion 211 by the CVD method. Next, the dielectric layer 263 formed of a silicon nitride film is formed on the first conductive layer 261 by the CVD method. Thereafter, the second conductive layer 262 formed of a polysilicon film containing a dopant such as phosphorus is formed on the dielectric layer 263 by the CVD method. Here, the first conductive layer 261 and the second conductive layer 262 are preferably formed of the same material from the viewpoint of ease of manufacturing.

Figure 17:
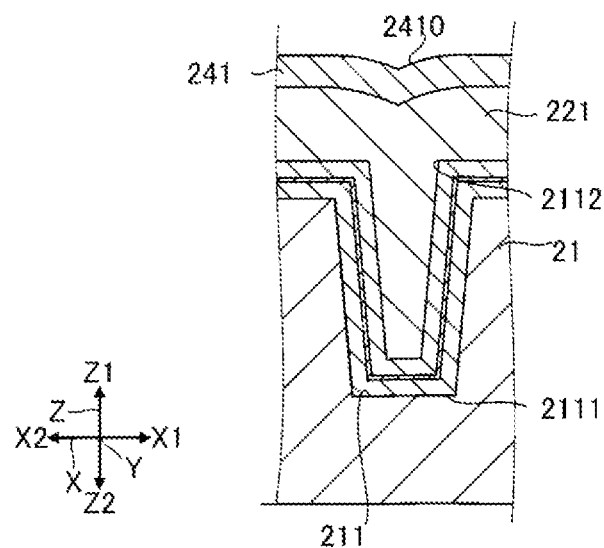
FIG. 17 is a view for explaining a first insulating film forming step and a scanning line forming step.

FIG. 17 is a view for explaining the first insulating film forming step S13 and the scanning line forming step S14. As illustrated in FIG. 5, FIG. 6, and FIG. 8, in the first insulating film forming step S13, the insulating layer 221 as the "first insulating film" is formed on the capacitance element 26. The insulating layer 221 is formed by the CVD method or the like, for example. On the surface of the insulating layer 221 in the Z1 direction, a portion that is recessed in conformity with the first recessed portion 211 is formed. Next, as illustrated in FIG. 5, FIG. 6, FIG. 9, and FIG. 17, in the scanning line forming step S14, the scanning lines 241 are formed on the insulating layer 221. For example, the scanning lines 241 are formed in such manner that a metal film is formed on the insulating layer 221 by a sputtering method or a vapor deposition method, and the metal film is etched using a resist mask. On the scanning line 241, the portion 2410 that is recessed in the Z2 direction in accordance with the first recessed portion 211 is formed.

Figure 18:
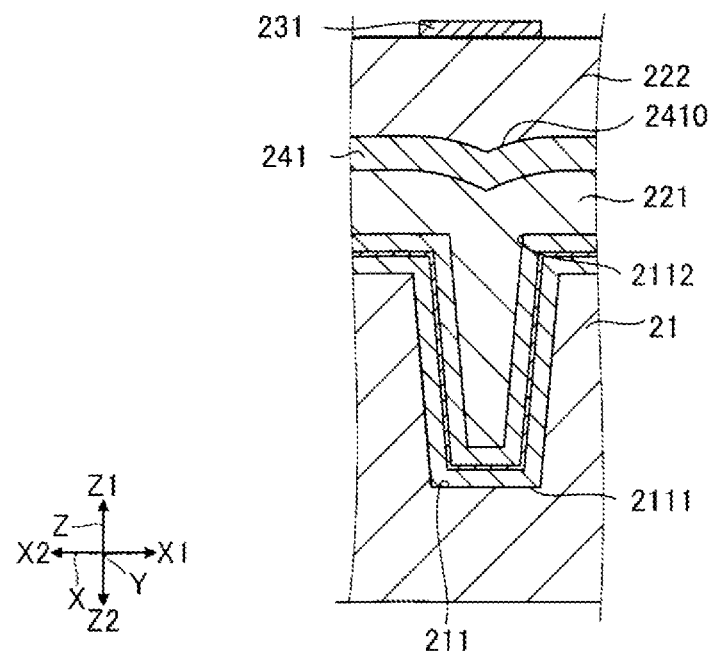
FIG. 18 is a view for explaining a second insulating film forming step and a semiconductor layer forming step.

FIG. 18 is a view for explaining the second insulating film forming step S15 and the semiconductor layer forming step S16. As illustrated in FIG. 5, FIG. 6, and FIG. 9, in the second insulating film forming step S15, the insulating layer 222 as the "second insulating film" is formed on the scanning line 241. The insulating layer 222 is formed by the CVD method or the like, for example. Here, when the first recessed portion 211 is formed such that an aspect ratio, that is a ratio between a length in a vertical direction and a length in a lateral direction, becomes equal to or more than 1.5 in the above-mentioned step, compared to a case where the aspect ratio is less than 1.5, the flatness of the surface of the insulating layer 222 in the Z1 direction can be increased without applying a planarization treatment by a CMP method to the insulating layer 222. Accordingly, even if the planarization treatment is not applied to the insulating layer 222, the surface of the insulating layer 222 in the Z1 direction becomes a planar surface. Accordingly, the number of manufacturing steps of the element substrate 2 can be reduced and hence, the manufacture of the element substrate 2 can be simplified.

Next, as illustrated in FIG. 5, FIG. 6, and FIG. 9, in the semiconductor layer forming step S16, the semiconductor layer 231 is formed on the insulating layer 222. For example, an amorphous silicon film is formed, and the amorphous silicon film is subjected to heat treatment to form a crystallized polysilicon film. Then, by selectively injecting a dopant into the polysilicon film, the semiconductor layer 231 is formed. Here, the surface of the insulating layer 222 in the Z1 direction has excellent flatness and hence, a possibility that unevenness occurs on the semiconductor layer 231 formed on the insulating layer 222 due to an influence of the first recessed portion 211 is decreased.

Heretofore, the configuration of the element substrate 2 and the method of manufacturing a portion of the element substrate 2 have been described. As described above, the electro-optical device 100 includes the first substrate 21 having the first recessed portions 211, the light-shielding scanning lines 241, the capacitance elements 26 each having the first conductive layer 261, the second conductive layer 262, and the dielectric layer 264, and the transistors 23 each including the semiconductor layer 231 having the source region 231c, the channel region 231a, and the drain region 231b. Further, the capacitance element 26, the scanning line 241, and the transistor 23 are disposed in this order from the first substrate 21. Therefore, the capacitance element 26 is disposed below the transistor 23. Accordingly, unlike the related art, the data lines 242 and the like are not disposed above the transistor 23 via the capacitance element 26. As a result, the data line 242 and the like can be easily disposed closer to the transistor 23 compared to the related art. For this reason, an intrusion of light advancing in the Z2 direction toward the transistor 23 from between the transistor 23 and the data line 242 or the like can be suppressed compared to the related art. Therefore, the light shielding property with respect to the transistor 23 can be enhanced. Accordingly, it is possible to suppress the occurrence of a phenomenon that an operation of the transistor 23 becomes unstable, as a result, the possibility that a display failure such as brightness irregularities occurs can be suppressed.

Further, the first substrate 21 includes the first recessed portion 211, and the capacitance element 26 includes the first element portion 265 disposed in the first recessed portion 211. The capacitance element 26 has the first element portion 265 and hence, the capacitance value can be increased without stacking a plurality of capacitance elements 26. Further, there is no need to provide the plurality of capacitance elements 26 and hence, it is possible to suppress the increase of a contact area for coupling the plurality of capacitance elements 26 to each other. Accordingly, it is possible to suppress the lowering of the numerical aperture. Therefore, it is possible to increase the capacitance value and to suppress the lowering of the numerical aperture and hence, excellent display quality can be obtained.

As described above, according to the electro-optical device 100 including the element substrate 2 of the present embodiment, it is possible to suppress the lowering of the numerical aperture while enhancing the light shielding property and increasing the capacitance value. Accordingly, it is possible to enhance the display quality compared to the configuration of the related art.

Further, in the present embodiment, the second element portion 266 and the third element portion 267 are provided. Accordingly, it is possible to further increase the capacitance value compared to a case where the second element portion 266 and the third element portion 267 are not provided.

Further, the capacitance element 26 has the first element portion 265 and hence, it is possible to increase the capacitance value without stacking the plurality of capacitance elements 26. Accordingly, it is unnecessary to stack the plurality of capacitance elements 26. Accordingly, the element substrate 2 can be easily manufactured.

Further, each of the first conductive layer 261 and the second conductive layer 262 are configured to contain polysilicon. For this reason, for example, it is possible to suppress the possibility that a defect occurs in the first conductive layer 261 and the second conductive layer 262 due to heat generated by annealing treatment at the time of manufacturing the semiconductor layer 231. Accordingly, compared to a case where the first conductive layer 261 and the second conductive layer 262 contain metal, for example, the possibility that cracks or the like occur in the first substrate 21 can be suppressed by forming the first conductive layer 261 and the second conductive layer 262. As a result, the capacitance element 26 can be provided below the transistor 23. Therefore, the capacitance element 26 can be easily manufactured, and the degree of freedom in selection of a material for forming the capacitance element 26 can be increased. As described above, according to the present embodiment, compared to the related art, the display quality can be enhanced and the manufacture of the electro-optical device 100 can be facilitated.

Further, it is preferable that the capacitance element 26 and the insulating layer 221 have a reflection enhancing property. The capacitance element 26 and the insulating layer 221 have the reflection enhancing property and hence, a portion of the light LL can be transmitted through an interface between the first substrate 21 and the first conductive layer 261, an interface between the first conductive layer 261 and the dielectric layer 263, an interface between the dielectric layer 263 and the second conductive layer 262, an interface between the second conductive layer 262 and the insulating layer 221, and an interface between the insulating layer 221 and the scanning line 241, and the remaining portion of the light LL can be reflected on these interfaces. Accordingly, the light shielding property with respect to the semiconductor layer 231 can be enhanced.

Particularly, it is preferable to adopt the configuration where the reflection of light at the interface between the capacitance element 26 and the insulating layer 221, and the reflection of light at the interface between the insulating layer 221 and the scanning line 241 reinforce each other. With such a configuration, the reflection ratio and the optical density (OD) value of the light LL below the transistor 23 can be increased. Accordingly, by providing the capacitance element 26, the insulating layer 221, and the scanning line 241 below the transistor 23, compared to a case where only the scanning line 241 is provided below the transistor 23, the light shielding property with respect to the transistor 23 can be further enhanced without excessively increasing the thickness of the scanning line 241. Further, there is no need to excessively increase the thickness of the scanning line 241 and hence, it is possible to suppress the occurrence of cracks on the insulating layer 221.

Here, for example, by adjusting respective film thicknesses, respective materials, and respective refractive indexes of the capacitance element 26 and the insulating layer 221, the capacitance element 26 and the insulating layer 221 can be configured to have the reflection enhancing property.

Further, as described above, the first element portion 265 is disposed along the semiconductor layer 231 as viewed in plan view. Accordingly, compared to a case where the first element portion 265 is not disposed along the semiconductor layer 231, it is possible to suppress the lowering of the numerical aperture.

Further, as the material for forming the scanning line 241, the above-mentioned metal materials can be named. Amongst the above-mentioned metal materials, it is preferable that the scanning line 241 be formed of tungsten or a material containing tungsten such as a tungsten silicide, a tungsten titanium nitride or the like. Amongst the metals, tungsten is a material with a high melting point. For this reason, by containing tungsten, for example, it is possible to suppress the possibility that a defect occurs in the scanning line 241 due to heat generated by annealing treatment at the time of manufacturing the semiconductor layer 231.

As described above, the scanning line 241 includes the portion 2410 that overlaps with the first element portion 265 as viewed in plan view and is recessed toward the first element portion 265. Due to the presence of the portion 2410, compared to a case where there is no portion 2410, light incident on the surface of the scanning line 241 in the Z2 direction can be efficiently reflected.

Figure 19:
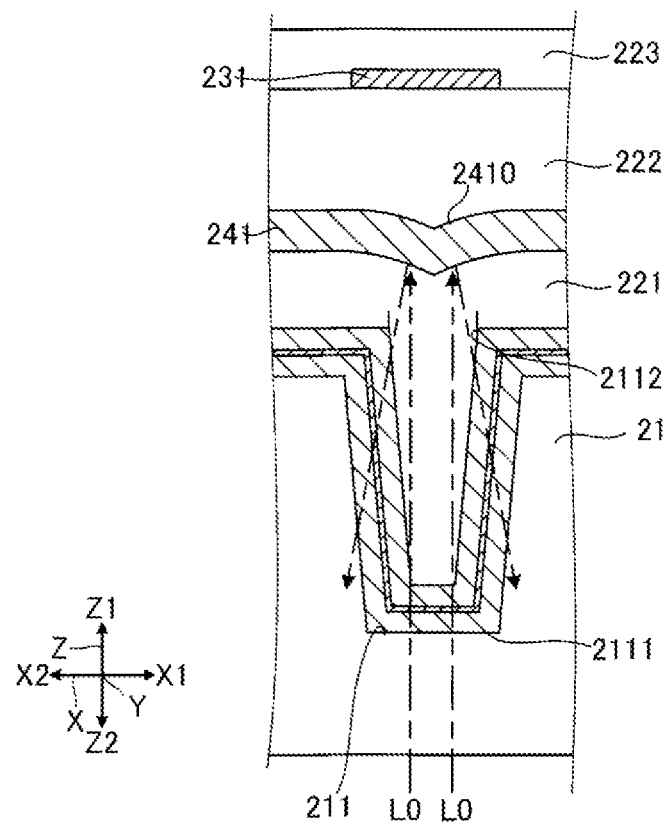
FIG. 19 is a view for explaining reflection of light at the scanning line illustrated in FIG. 5.

FIG. 19 is a view for explaining reflection of light at the scanning line 241 illustrated in FIG. 5. For example, when a configuration where the light LL is incident from the counter substrate 3 side is taken into consideration, there may be a case where return light of light that transmits the element substrate 2 is incident from the first substrate 21. As illustrated in FIG. 19, the scanning line 241 includes the portion 2410 that is recessed toward the first element portion 265 and hence, light L0 such as return light is obliquely incident on the surface, in the Z2 direction, of the portion 2410 obliquely. Accordingly, the light L0 incident from the first substrate 21 can be efficiently reflected by the portion 2410. With such a configuration, compared to a case where a portion of the scanning line 241 overlapping with the semiconductor layer 231 as viewed in plan view is in a flat configuration, the light-shielding property of the scanning line 241 can be increased. Accordingly, compared to the case where there is no portion 2410, it is possible to effectively suppress the incidence of light on the transistor 23.

Here, the aspect ratio of the first recessed portion 211 is equal to or more than 1.5 and hence, the portion 2410 that is recessed can be easily formed on the scanning line 241. However, the aspect ratio may not be equal to or more than 1.5. Even when the aspect ratio is not equal to or more than 1.5, provided that the portion 2410 is provided, compared to the case where there is no portion 2410, it is possible to effectively suppress the incidence of light on the transistor 23.

Further, as described above, the surface of the insulating layer 222 on a side opposite to the first substrate 21 is a planar surface. Accordingly, compared to a case where the insulating layer 222 has unevenness, the possibility that unevenness occurs in the semiconductor layer 231 formed on the insulating layer 222 can be suppressed. Further, the aspect ratio (D1/W1) is equal to or more than 1.5 and hence, compared to a case where the aspect ratio is less than 1.5, the possibility that the recess is generated in the semiconductor layer 231 due to an influence of the first recessed portion 211 can be suppressed.

Further, it is more preferable that the aspect ratio be in a range of from 1.7 or more to 3.0 or less. By causing the aspect ratio to fall within such a range, the capacitance element 26 can be formed in the first recessed portion 211 and, particularly, the possibility that the recess is generated in the semiconductor layer 231 can be suppressed.

Further, it is preferable that the width W1 of the bottom surface 2111 of the first recessed portion 211 be equal to or less than the width W0 of the source region 231c of the semiconductor layer 231. Accordingly, compared to a case where the width W1 is larger than the width W0, the possibility that the unevenness is generated in the semiconductor layer 231 due to an influence of the first recessed portion 211 can be suppressed.

Further, the first element portion 265 overlaps with the semiconductor layer 231 as viewed in plan view. Accordingly, compared to a case where the first element portion 265 does not overlap with the semiconductor layer 231, it is possible to suppress the lowering of the numerical aperture. Particularly, the first element portion 265 overlaps with the source region 231c, the channel region 231a, and the drain region 231b as viewed in plan view. That is, the first element portion 265 overlaps with the whole semiconductor layer 231 as viewed in plan view. Accordingly, compared to a case where the first element portion 265 overlaps with a portion of the semiconductor layer 231, it is possible to increase the capacitance value while suppressing the lowering of the numerical aperture.

Further, the first element portion 265 of the capacitance element 26 is disposed in the first recessed portion 211 and overlaps with the channel region 231a as viewed in plan view. Therefore, the distance between the channel region 231a and the capacitance element 26 can be increased compared to a case where the capacitance element 26 is formed on a planar surface. Accordingly, when the first conductive layer 261 and the second conductive layer 262 are formed of polysilicon containing a dopant such as phosphorus, the possibility that the dopant is diffused into the channel region 231a of the semiconductor layer 231 can be suppressed. As a result, the occurrence of an erroneous operation of the transistor 23 is suppressed.

Further, it is preferable for the insulating layers 221, 222 to include an inorganic material containing silicon, and more preferable to include a silicon oxide. Particularly, the material for forming the insulating layers 221, 222 is an inorganic material containing silicon and hence, when the first conductive layer 261 and the second conductive layer 262 are formed of polysilicon containing a dopant such as phosphorus, the possibility that the dopant is diffused into the semiconductor layer 231 can be suppressed compared to a case where the insulating layers 221, 222 are formed of a material other than the inorganic material containing silicon. Further, the material for forming the insulating layers 221, 222 is a silicon oxide and hence, the possibility that the dopant is diffused into the semiconductor layer 231 can be particularly effectively suppressed.

Further, the electro-optical device 100 includes the first substrate 21, the insulating layer 221, the capacitance elements 26 each having the first conductive layer 261, the second conductive layer 262, and the dielectric layer 264, and the transistors 23 each including the semiconductor layer 231 having the source region 231c, the channel region 231a, and the drain region 231b. The capacitance elements 26, the insulating layer 221, the insulating layer 222, and the transistors 23 are disposed in this order from the first substrate 21. Further, the first substrate 21 has the first recessed portions 211 each of which overlaps with the corresponding semiconductor layer 231 as viewed in plan view and is disposed along the corresponding semiconductor layer 231 as viewed in plan view. The capacitance element 26 has the first element portion 265 that is disposed in the first recessed portion 211, overlaps with the semiconductor layer 231 as viewed in plan view, and is disposed along the semiconductor layer 231 as viewed in plan view. The insulating layer 222 is disposed in the first recessed portion 211.

The capacitance element 26 has the first element portion 265 and hence, the capacitance value can be increased without stacking the plurality of capacitance elements 26. Further, by providing the first element portion 265, the capacitance value can be increased without stacking the plurality of capacitance elements 26 and hence, the element substrate 2 can be easily manufactured. Further, there is no need to provide the plurality of capacitance elements 26 and hence, it is possible to suppress the increase of a contact area for coupling the plurality of capacitance elements 26 to each other. Accordingly, it is possible to suppress the lowering of the numerical aperture. Further, the first element portion 265 overlaps with the semiconductor layer 231 as viewed in plan view and hence, compared to a case where the first element portion 265 does not overlap with the semiconductor layer 231 as viewed in plan view, it is possible to suppress the lowering of the numerical aperture. Accordingly, it is possible to increase the capacitance value and to increase the numerical aperture. Accordingly, it is possible to enhance the display quality compared to the related art.

Particularly, the first element portion 265 overlaps with the source region 231c, the channel region 231a, and the drain region 231b as viewed in plan view. That is, the first element portion 265 overlaps with the whole semiconductor layer 231 as viewed in plan view. Therefore, compared to a case where the first element portion 265 overlaps with a portion of the semiconductor layer 231, the capacitance value can be increased while suppressing the lowering of the numerical aperture. Further, in the present embodiment, the second element portion 266 and the third element portion 267 are provided and hence, the capacitance value can be increased compared to a case where the second element portion 266 and the third element portion 267 are not provided.

Additionally, the capacitance element 26 is disposed below the semiconductor layer 231 and hence, there is no need to form the capacitance elements 26 on the semiconductor layer 231. Accordingly, the distance between the semiconductor layer 231 and the various lines can be easily shortened compared to a case where the capacitance element 26 is provided above the semiconductor layer 231. As a result, the intrusion of light in the Z1 direction into the semiconductor layer 231 can be further effectively suppressed.

Further, the aspect ratio (D1/W1) of the first recessed portion 211 is equal to or more than 1.5. The aspect ratio (D1/W1) is equal to or more than 1.5 and hence, compared to a case where the aspect ratio is less than 1.5, the possibility that the recess is generated in the semiconductor layer 231 due to an influence of the first recessed portion 211 can be suppressed. Accordingly, as has been described in the above-mentioned manufacturing method, processing of planarizing an upper surface of the insulating layer 222 can be omitted. Accordingly, the element substrate 2 can be further easily manufactured compared to a case where it is necessary to perform processing of planarizing the upper surface. As a result, the manufacture of the element substrate 2 can be simplified compared to the related art.

Further, as described above, even when the processing of planarizing the upper surface of the insulating layer 222 is omitted, the surface of the insulating layer 222 on a side opposite to the first substrate 21 is a planar surface. Accordingly, the display quality can be enhanced, and the manufacture of the element substrate 2 can be simplified.

Further, as described above, the scanning line 241 having the light shielding property is disposed between the capacitance element 26 and the transistor 23. Accordingly, compared to the case where the film having a light shielding property such as the scanning line 241 is not present between the capacitance element 26 and the transistor 23, it is possible to largely suppress the incidence of light in the Z1 direction on the transistor 23.

Further, when the first conductive layer 261 and the second conductive layer 262 of the capacitance element 26 are formed of polysilicon, it is preferable for the capacitance element 26 and the insulating layer 221 to have a reflection enhancing property. The capacitance element 26 and the insulating layer 221 have the reflection enhancing property and hence, a portion of the light LL can be transmitted through an interface between the first substrate 21 and the first conductive layer 261, an interface between the first conductive layer 261 and the dielectric layer 263, an interface between the dielectric layer 263 and the second conductive layer 262, an interface between the second conductive layer 262 and the insulating layer 221, and an interface between the insulating layer 221 and the scanning line 241, and the remaining portion of the light LL can be reflected on these interfaces. Accordingly, the light shielding property with respect to the semiconductor layer 231 can be enhanced.

Particularly, it is preferable to adopt the configuration where the reflection of light at the interface between the capacitance element 26 and the insulating layer 221, and the reflection of light at the interface between the insulating layer 221 and the scanning line 241 reinforce each other. With such a configuration, the reflection ratio and the optical density (OD) value of the light LL below the transistor 23 can be increased. Accordingly, by providing the capacitance element 26, the insulating layer 221, and the scanning line 241 below the transistor 23, compared to a case where only the scanning line 241 is provided below the transistor 23, the light shielding property with respect to the transistor 23 can be enhanced without excessively increasing the thickness of the scanning line 241. Further, there is no need to excessively increase the thickness of the scanning line 241 and hence, it is possible to suppress the occurrence of cracks on the insulating layer 221.

Here, for example, by adjusting respective film thicknesses, respective materials, and respective reflective indexes of the capacitance element 26 and the insulating layer 221, the capacitance element 26 and the insulating layer 221 can be configured to have the reflection enhancing property.

Further, the first conductive layer 261 and the second conductive layer 262 are configured to contain polysilicon and hence, the heat resistance of the first conductive layer 261 and the second conductive layer 262 can be increased compared to a case where the first conductive layer 261 and the second conductive layer 262 are configured to contain a metal material. Accordingly, the occurrence of a failure such as cracks in the first substrate 21 and the like can be suppressed at the time of manufacturing the first substrate 21 and the like. Further, the occurrence of film peeling of the first conductive layer 261 and the second conductive layer 262 can be reduced.

It is preferable for the insulating layer 222 to contain an inorganic material containing silicon such as a silicon oxide, a silicon oxynitride, or the like, and more preferable to contain the silicon oxide. The insulating layer 222 includes the inorganic material containing silicon and hence, the occurrence of a failure such as cracks in the first substrate 21 and the like can be suppressed at the time of manufacturing the first substrate 21 and the like. Further, the space of the first recessed portion 211 can be efficiently filled with the insulating layer 222. Further, for example, when the capacitance element 26 is formed of polysilicon containing a dopant such as phosphorus, the possibility that the dopant is diffused into the semiconductor layer 231 can be suppressed.

2. Modification

The embodiment exemplified above can be variously modified. Specific modification aspects applicable to the above-mentioned embodiment are exemplified hereinafter. Two or more modes arbitrarily selected from the following exemplifications can be appropriately used in combination as long as mutual contradiction does not arise.

In the above-mentioned embodiment, an active matrix type electro-optical device 100 is exemplified. However, the present disclosure is not limited to the active matrix type electro-optical device 100, and as the driving method of the electro-optical device 100, a passive matrix method or the like may be adopted, for example.

The driving method of the "electro-optical device" is not limited to a vertical electric field method, and may be a lateral electric field method. As the lateral electric field method, an In Plane Switching (IPS) mode can be named, for example. Further, as the vertical electric field method, a Twisted Nematic (TN) mode, a Vertical Alignment (VA) mode, a PVA mode, and an Optically Compensated Bend (OCB) mode can be named.

3. Electronic Apparatus

The electro-optical device 100 can be used for various electronic apparatuses.

Figure 20:
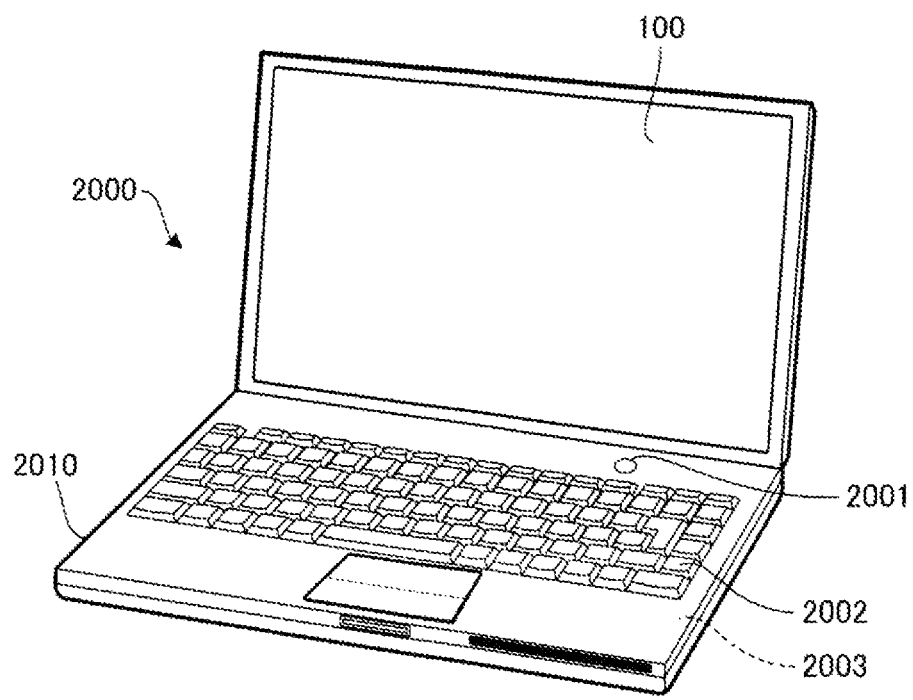
FIG. 20 is a perspective view illustrating a personal computer that is an example of an electronic apparatus.

FIG. 20 is a perspective view illustrating a personal computer 2000 that is an example of the electronic apparatus. The personal computer 2000 includes an electro-optical device 100 configured to display various images, a main body portion 2010 in which a power source switch 2001 and a keyboard 2002 are installed, and a control unit 2003. The control unit 2003 includes a processor and a memory, for example, and is configured to control an operation of the electro-optical device 100.

Figure 21:
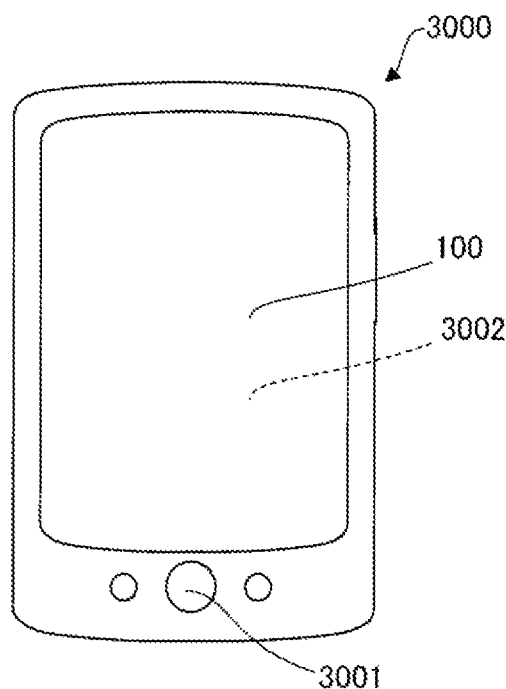
FIG. 21 is a plan view illustrating a smart phone that is an example of the electronic apparatus.

FIG. 21 is a plan view illustrating a smart phone 3000 that is an example of the electronic apparatus. The smartphone 3000 includes an operation button 3001, an electro-optical device 100 configured to display various images, and a control unit 3002. Contents displayed on a screen of the electro-optical device 100 are changed in accordance with an operation of the operation button 3001. The control unit 3002 includes a processor and a memory, for example, and is configured to control an operation of the electro-optical device 100.

Figure 22:
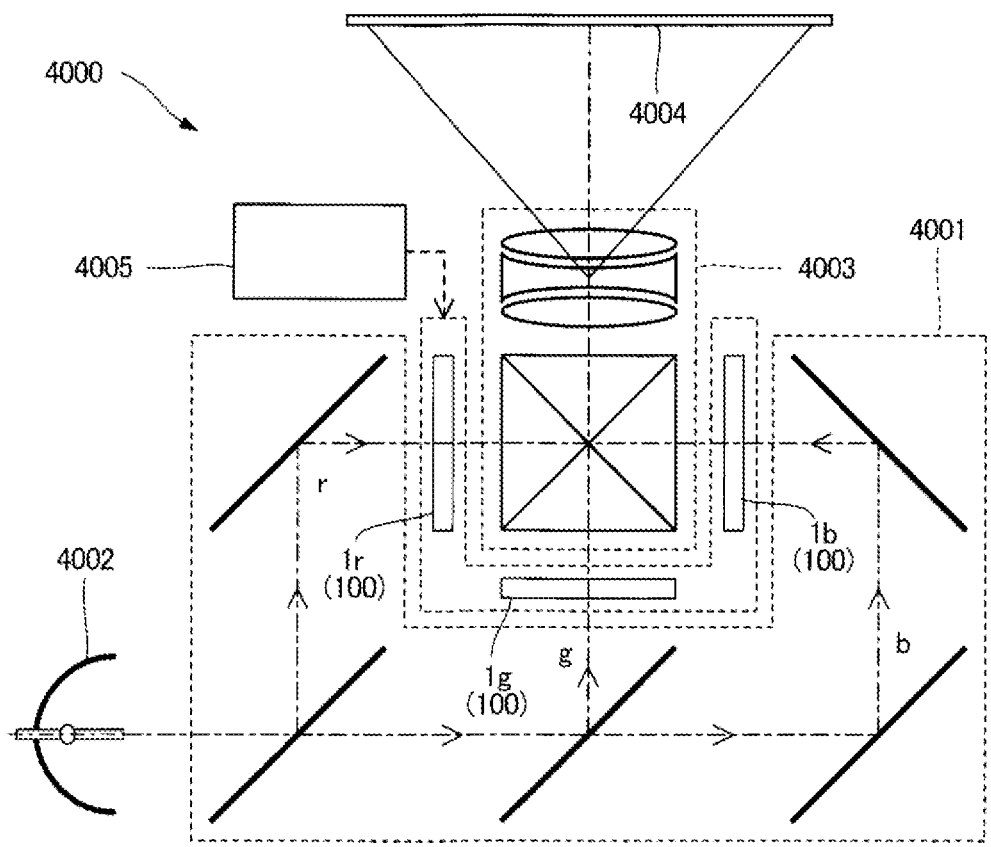
FIG. 22 is a schematic view illustrating a projector that is an example of the electronic apparatus.

FIG. 22 is a schematic view illustrating a projector that is an example of the electronic apparatus. A projection-type display device 4000 is a three-plate type projector, for example. An electro-optical device 1r is an electro-optical device 100 corresponding to a red display color, an electro-optical device 1g is an electro-optical device 100 corresponding to a green display color, and an electro-optical device 1b is an electro-optical device 100 corresponding to a blue display color. That is, the projection-type display device 4000 includes three electro-optical devices 1r, 1g, and 1b that respectively correspond to display colors of red, green, and blue. A control unit 4005 includes a processor and a memory, for example, and is configured to control operations of the electro-optical devices 100.

An illumination optical system 4001 supplies a red component r of light emitted from an illumination device 4002 as a light source to the electro-optical device 1r, supplies a green component g of the light to the electro-optical device 1g, and supplies a blue component b of the light to the electro-optical device 1b. Each of the electro-optical devices 1r, 1g, and 1b functions as an optical modulator, such as a light valve, that modulates respective rays of the monochromatic light supplied from the illumination optical system 4001 depending on display images. A projection optical system 4003 is configured to combine the rays of the light emitted from each of the electro-optical devices 1r, 1g, and 1b and to project the combined light to a projection surface 4004.

The above-mentioned electronic apparatus includes the above-mentioned electro-optical device 100, and the control unit 2003, 3002, or 4005. By providing the above-mentioned electro-optical device 100, the display quality of the personal computer 2000, the smartphone 3000, or the projection-type display device 4000 can be enhanced.

Here, the electronic apparatus to which the electro-optical device according to the present disclosure is applied is not limited to the exemplified apparatuses. For example, as the electronic apparatus, Personal Digital Assistants (PDA), a digital steel camera, a television receiver set, a video camera, a car navigation device, a display device for in-vehicle use, an electronic organizer, an electronic paper, an electronic calculator, a word processor, a workstation, a visual telephone, a Point of sale (POS) terminal, and the like can be named. Further, as the electronic apparatus to which the present disclosure is applied, an apparatus, or the like, provided with a printer, a scanner, a composite machine, a video player, or a touch panel can be named.

Although the present disclosure has been described heretofore based on the preferred embodiment and the modification, the present disclosure is not limited to the above-mentioned embodiment and the modification. In addition, the configuration of each component of the present disclosure may be replaced with any configuration that exerts the equivalent functions of the above-described embodiments, and to which any configuration may be added.

Further, in the above-mentioned description, the description has been made by taking the liquid crystal display device as an example of the electro-optical device of the present disclosure. However, the electro-optical device of the present disclosure is not limited to the liquid crystal device. For example, the electro-optical device of the present disclosure is also applicable to an image sensor or the like.

What is claimed is:

1. An electro-optical device comprising:
   a substrate extending along a first direction and having a recessed portion that includes a bottom surface and a side surface;
   a laminated film disposed along the bottom surface and the side surface of the recessed portion, and having a first conductive layer, a dielectric layer, and a second conductive layer;
   a first insulating film covering the laminated film, a portion of the first insulating film being disposed inside the recessed portion;
   a light shielding film;
   a second insulating film; and
   a semiconductor layer having a source region, a channel region, and a drain region disposed along the first direction, wherein
   the laminated film, the first insulating film, the light shielding film, the second insulating film, and the semiconductor layer are disposed in this order from a substrate side, and a length of the recessed portion in a depth direction is larger than a length of a bottom surface of the recessed portion in a width direction along a second direction intersecting with the first direction.

2. The electro-optical device according to claim 1, comprising:
   a capacitance element having the laminated film; and
   a transistor having the semiconductor layer, wherein
   the capacitance element, the first insulating film, the light-shielding film, the second insulating film, and the transistor are disposed in this order from a substrate side,
   the capacitance element includes a trench portion inside the recessed portion,
   a portion of the first insulating film is disposed in the trench portion, and
   an aspect ratio of the trench portion is larger than 1.

3. The electro-optical device according to claim 2, wherein
   the trench portion overlaps with the source region, the channel region, and the drain region via the first insulating film, the light-shielding film, and the second insulating film.

4. The electro-optical device according to claim 2, wherein
   the light shielding film overlaps with the trench portion via the first insulating film, and includes a portion recessed toward the trench portion.

5. The electro-optical device according to claim 2, wherein
   the recessed portion of the substrate overlaps with the semiconductor layer and is disposed along the semiconductor layer as viewed in a plan view, and
   the trench portion overlaps with the semiconductor layer and is disposed along the semiconductor layer as viewed in the plan view.

6. The electro-optical device according to claim 1, wherein
   a surface of the first insulating film on a side opposite to the substrate is a flat surface.

7. The electro-optical device according to claim 1, wherein
   a surface of the second insulating film on a side opposite to the light-shielding film is a planar surface.

8. The electro-optical device according to claim 1, wherein the semiconductor layer has a low concentration drain region between the drain region and the channel region, the low concentration drain region having a lower dopant concentration than a dopant concentration of the drain region, and a width of a bottom surface of the recessed portion along the second direction is equal to or less than a width of the low concentration drain region along the second direction.

9. The electro-optical device according to claim 8, comprising:

a third insulating film disposed so as to cover the semiconductor layer; and a drain electrode electrically coupled to the drain region, wherein the low concentration drain region overlaps with a bottom surface of the recessed portion via the second insulating film, the light shielding film, the first insulating film, and the laminated film, and overlaps with the drain electrode via the third insulating film.

10. The electro-optical device according to claim 9, wherein as viewed in a plan view, a contact hole for electrically coupling the light shielding film and a gate electrode to each other is disposed on both sides of the low concentration drain region, and as viewed in the plan view, a contact hole for electrically coupling a relay electrode that is electrically coupled to the drain electrode and the first conductive layer to each other is disposed on a side of the drain region opposite to a low concentration drain region side.

11. The electro-optical device according to claim 1, wherein the first insulating film and the second insulating film contain an inorganic material containing silicon, the first conductive layer and the second conductive layer contain polysilicon, and the dielectric layer contains silicon nitride.

12. The electro-optical device according to claim 1, wherein the light shielding film contains tungsten.

13. An electronic apparatus comprising:

the electro-optical device according to claim 1, and a control unit configured to control an operation of the electro-optical device.

* * * * *